United States Patent
Yamagami et al.

(10) Patent No.: US 7,701,018 B2
(45) Date of Patent: Apr. 20, 2010

(54) SEMICONDUCTOR DEVICE AND METHOD FOR MANUFACTURING SAME

(75) Inventors: Shigeharu Yamagami, Tokyo (JP); Hitoshi Wakabayashi, Tokyo (JP); Kiyoshi Takeuchi, Tokyo (JP); Atsushi Ogura, Tokyo (JP); Masayasu Tanaka, Tokyo (JP); Masahiro Nomura, Tokyo (JP); Koichi Takeda, Tokyo (JP); Toru Tatsumi, Tokyo (JP); Koji Watanabe, Tokyo (JP); Koichi Terashima, Tokyo (JP)

(73) Assignee: NEC Corporation, Tokyo (JP)

( * ) Notice: Subject to any disclaimer, the term of this patent is extended or adjusted under 35 U.S.C. 154(b) by 553 days.

(21) Appl. No.: 10/593,300
(22) PCT Filed: Mar. 22, 2005
(86) PCT No.: PCT/JP2005/005137
§ 371 (c)(1), (2), (4) Date: Nov. 17, 2006
(87) PCT Pub. No.: WO2005/091374
PCT Pub. Date: Sep. 29, 2005

(65) Prior Publication Data
US 2008/0251849 A1 Oct. 16, 2008

(30) Foreign Application Priority Data
Mar. 19, 2004 (JP) .............................. 2004-080370

(51) Int. Cl.
*H01L 27/088* (2006.01)
(52) U.S. Cl. .................. 257/401; 438/283; 257/E29.13
(58) Field of Classification Search .............. 257/347, 257/368, 401; 438/149, 151, 157, 164, 283, 438/284
See application file for complete search history.

(56) References Cited

U.S. PATENT DOCUMENTS

| | | | |
|---|---|---|---|
| 6,642,090 B1 * | 11/2003 | Fried et al. | 438/164 |
| 6,756,643 B1 * | 6/2004 | Achuthan et al. | 257/365 |
| 6,909,147 B2 * | 6/2005 | Aller et al. | 257/347 |
| 2004/0048424 A1 * | 3/2004 | Wu et al. | 438/154 |
| 2005/0145932 A1 * | 7/2005 | Park et al. | 257/328 |

FOREIGN PATENT DOCUMENTS

| | | |
|---|---|---|
| JP | 8-181323 | 7/1996 |
| JP | 2001-298194 | 10/2001 |
| JP | 2002-118255 | 4/2002 |
| JP | 2003-229575 | 8/2003 |
| WO | WO 2005/022637 | 3/2005 |
| WO | WO 2005/038931 | 4/2005 |

* cited by examiner

*Primary Examiner*—Evan Pert
*Assistant Examiner*—Andres Munoz
(74) *Attorney, Agent, or Firm*—Young & Thompson

(57) ABSTRACT

A semiconductor device comprising a first semiconductor region and a second semiconductor region,
(a) wherein a field effect transistor is comprised of the first semiconductor region comprising at least one semiconductor layer(s) protruding upward from a substrate, a gate electrode(s) formed via an insulating film such that the gate electrode(s) strides over the semiconductor layer(s) and source/drain regions provided in the semiconductor layer(s) on both sides of the gate electrode(s), whereby a channel region is formed in at least both sides of the semiconductor layer(s),
(b) wherein the second semiconductor region comprises semiconductor layers protruding upward from the substrate and placed, at least opposing the first semiconductor region at both ends in the direction perpendicular to a channel current direction and the side surface of the semiconductor layers facing the first semiconductor region is parallel to the channel current direction.

34 Claims, 29 Drawing Sheets

PRIOR ART

PRIOR ART

PRIOR ART

SEMICONDUCTOR DEVICE AND METHOD FOR MANUFACTURING SAME

TECHNICAL FIELD

The present invention relates to a semiconductor device having a field effect transistor with excellent operation properties and reliability, as well as a manufacturing process thereof.

BACKGROUND OF THE INVENTION

There has been developed a fin-type MIS type field effect transistor (hereinafter, referred to as "MISFET") having a protrusion consisting of a semiconductor layer in which a main channel region is formed in side surface of the protrusion. A fin-type MISFET is known to be advantageous in terms of size reduction as well as improvement in various properties such as improvement in cutoff properties or carrier mobility and reduction in short channel effect and punch-through.

FIG. 1 shows a semiconductor device containing an MISFET having a single structure comprising a single cuboid semiconductor layer. FIG. 1(a) is a plan view of this semiconductor device and FIG. 1(b) is a cross-sectional view taken on line A-A' of FIG. 1(a). In the structure shown in FIG. 1, on a silicon substrate 5 and a buried oxide film 4 is formed a cuboid semiconductor layer 38, on which is formed a gate insulating film 7. Furthermore, a gate electrode 6 is formed, which strides over the semiconductor layer 38 and the gate insulating film 7. A contact hole 13 is formed in gate electrode 22 on a substrate. In the contact hole 13 is buried a plug, which is connected to an upper interconnection 14. In this cuboid semiconductor layer 38, source/drain regions are formed in both sides of the gate electrode 6 and a channel region is formed in a region under the gate insulating film 7 (the upper and the side surfaces of the cuboid semiconductor layer 38). A channel width corresponds to the total of a height "H" of the cuboid semiconductor layer 38 multiplied by 2 and its width "a", and a gate length corresponds to a width "d" of the gate electrode 6.

Japanese Patent Laid-open No. 2002-118255 has disclosed a multiple-fin MISFET having a plurality of cuboid semiconductor layers. FIG. 2(a) is a plan view of the semiconductor device and FIG. 2(b) is a cross-sectional view taken on line A-A' of FIG. 2(a) (FIG. 2 shows a device having three cuboid semiconductor layers). In this semiconductor device, a central semiconductor layer 29, a semiconductor layer 28 in one end and a semiconductor layer 26 in the opposite end to the semiconductor layer 28 are arranged in parallel and a gate electrode 6 is formed such that it strides over the center of these semiconductor layers. In the semiconductor layer 28 in one end, a contact is not formed in the source/drain regions, or if formed, is not used as a transistor for applying current to a channel region (FIG. 2 shows an example where a contact with the source/drain regions are not formed in the semiconductor layer 28).

A multiple-fin MISFET has been manufactured by the following process. FIGS. 3 and 4 show an example of this manufacturing process. FIGS. 3 and 4 are cross-sectional views in the width direction of a semiconductor layer (corresponding to the cross-sectional view taken on line A-A' of FIG. 2). First, a bonding or SIMOX method is used to prepare an SOI substrate consisting of a silicon wafer substrate 5, a SiO$_2$ oxide film 4 and monocrystalline silicon film 2. Next, a SiO$_2$ film 17 is formed on the surface of the SOI substrate by thermal oxidation and then, impurity is ion-implanted to the monocrystalline silicon film 2 (FIG. 3(a)). Then, the SiO$_2$ film 17 is etched off (FIG. 3(b)). Subsequently, to the whole surface of the monocrystalline silicon film 2 is applied a photoresist 9, which is patterned by photolithography to form a resist mask 9 in a given pattern (FIG. 3(c)). Next, using the resist mask 9 as an etching mask, the monocrystalline silicon film 2 is anisotropically dry-etched, and then the resist mask 9 is removed to form a substantially cuboid semiconductor layer 38 with a given height on the SiO$_2$ film 4 (FIG. 3(d)).

Next, a thin gate insulating film 7 is formed on the surface of the substantially cuboid monocrystalline silicon semiconductor layer 38 by, for example, thermal oxidation method or radical oxidation method. Furthermore, on the SiO$_2$ film 7 is formed a polysilicon film 19 by CVD method and the polysilicon film 19 is made conductive by impurity diffusion. Then, on the polysilicon film 19 is formed a resist film 9 and the resist film 9 is patterned in a given pattern by photolithography (FIG. 4(a)). Using the resist film 9 as a mask, the polysilicon film 19 is selectively etched to form a gate electrode 6 (FIG. 4(b)).

Then, after extension ion-implantation, CVD method is used to deposit, for example, a silicon oxide film. Furthermore, the deposited insulator is left on the side wall (not shown) of the gate electrode 6 by anisotropic etching. Thus, an insulating film is formed on each of the side surface of the substantially cuboid semiconductor layer 38 and the sidewall of the gate electrode 6.

Subsequently, using the gate electrode 6 and the like as a mask, the substantially cuboid semiconductor layer 38 is doped with impurity to form a source region and a drain region.

Then, on the structure is formed an interlayer insulating film 16 such as SiO$_2$ by CVD method, and then the interlayer insulating film 16 is planarized by CMP method. Then, a contact hole 13 is formed by photolithography and etching. The contact hole 13 is formed on the source/drain regions and the gate electrode 6. Subsequently, within the contact hole 13 are formed a tungsten film, an aluminum film, a TiN/Ti film and/or a laminated film of these. Thus, a contact plug is formed within the contact hole 13 (FIG. 4(c)). Next, an interconnection layer 14 electrically connecting to the contact plug is formed. The interconnection layer 14 is made of a conductive material containing aluminum as a main component. Then, a passivation film (not shown) is formed over these structures (FIG. 4(d)).

Japanese Patent Laid-open No. 2003-229575 has disclosed a manufacturing process wherein after pre-forming a stripe pattern convex semiconductor region over the whole surface of a substrate, the convex semiconductor region is removed except for necessary area to prevent proximity effect to the semiconductor region in both ends and to improve uniformity of etching.

SUMMARY OF THE INVENTION

However, in a conventional process for manufacturing a fin-type MISFET, when forming a plurality of semiconductor layers, semiconductor layers in both ends have forms and impurity concentrations different from those in the other semiconductor layers, sometimes leading to undesirable transistor properties. For example, when a semiconductor layer is formed using a resist mask, etching may be ununiform. It will be described below.

FIG. 5(a) shows a state after rinsing with rinse agent 1 after development (in this example, there is shown a process for manufacturing a multiple-fin MISFET in which a source/drain regions are not common.). FIG. 5(b) is a cross-sectional view taken on line A-A' of FIG. 5(*a*). After the rinsing, rinse agent 1 remains in a gap between resists because the gap is small. FIG. 5(*c*) illustrates influence of the remaining rinse agent 1 on the resist. FIG. 5(*d*) is a cross-sectional view taken on line A-A' of FIG. 5(*c*). The rinse agent is typically water. Resists 15 in both ends are in contact with rinse agent 1 only on their one side surface, so that the side surface of the end resist 15 in contact with rinse agent 1 is pulled by a surface tension in the rinse agent to be distorted toward the opposite resist (resist tilting). Therefore, in a later etching step, the semiconductor layers in both ends corresponding to these end resists 15 may not be uniformly etched.

Furthermore, in a conventional process for manufacturing a fin-type MISFET, semiconductor layers in both ends may become narrower during etching. FIG. 6(*a*) shows a state where after forming a resist pattern, a semiconductor layer is formed by etching. FIG. 6(*b*) is a cross-sectional view taken on line A-A' of FIG. 6(*a*). FIG. 6(*c*) shows a state where a semiconductor layer is formed in an MISFET having common source/drain regions by etching as described above. In FIG. 6, semiconductor layers 18 in both ends have a width ("a" in FIG. 6) smaller than a width in the other semiconductor layers (a'). It occurs due to asymmetric microloading effect.

Such microloading effect occurs because incident ions to a substrate during etching have a direction, specifically there are not only incident ions perpendicular to the substrate but also incident ions to the substrate at a certain angle. Thus, etching is slower in the middle semiconductor layers than in the end semiconductor layers, so that the end semiconductor layers are more etched than the middle semiconductor layers. The microloading effect becomes more significant when an aspect ratio (a ratio of an etching depth to an aperture pattern width) is high.

As described above, in the conventional process for manufacturing a semiconductor device, uniform etching cannot be achieved due to resist tilting and/or microloading effect, leading to unsatisfactory device operation properties.

In the conventional manufacturing process, a gate electrode may be less processable. FIG. 7(*a*) is a plan view showing a state where a gate insulating film 7 and a polysilicon film 19 are deposited on a plurality of arranged semiconductor layers 38 and a resist 9 as a mask is laminated and then exposure is conducted over the resist 9 for forming a gate electrode. FIG. 7(*b*) is a cross-sectional view taken on line A-A' of FIG. 7(*a*). There is formed a bump 20 in the resist 9 between an end semiconductor layers 18 and the substrate.

During exposing the resist 9, light is adjusted to be focused on a resist 33 on the upper surface of the semiconductor region 38 (35 in FIG. 7(*b*)). In contrast, in bump 20, a height of the resist 9 gradually decreases, so that a light spreads when reaching the resist (34 in FIG. 7(*b*): focus offset). As a result, the resist in the bump 20 is exposed over a larger area than the resist 33 on the upper surface, leading to a narrower resist 9 in the bump 20 (occurrence of size irregularity). When conducting etching using the resist 9 as a mask, size irregularity occurs also in the polysilicon film 19 in the bump 20 in response to size irregularity in the resist, a gate length d2 of the gate electrode 6 on the bump 20 becomes smaller than a gate length d1 of the gate electrode 6 on the semiconductor layer 38.

Furthermore, during etching for forming a gate electrode, gate length irregularity may occur in the gate electrode 24 in the bump due to microloading, in addition to the problem due to focus offset described above. It will be described below. FIG. 8(*a*) shows a state after etching for forming a gate electrode. FIG. 8(*b*) is a cross-sectional view taken on line A-A' of FIG. 8(*a*). Due to microloading effect described above during etching, an etching rate for the polysilicon film 36 between the semiconductor layers 18 and 38 is smaller than an etching rate for the polysilicon film 24 in the bump 20. Therefore, the polysilicon film 24 in the bump is more etched than the polysilicon film 36. Thus, a gate length d2 of the gate electrode in the bump 20 becomes smaller than a gate length d1 of a gate electrode on the semiconductor layers 18 and 38 (occurrence of gate length irregularity). As described above, the conventional manufacturing process may lead to unsatisfactory processability of a gate electrode. Thus, it is difficult to provide a semiconductor device exhibiting stable transistor properties.

FIG. 30 shows a step of ion implantation in a conventional process for manufacturing a semiconductor device. FIG. 30(*a*) is a plan view and FIG. 30(*b*) is a cross-sectional view taken on line B-B' of FIG. 30(*a*). As shown in FIG. 30, halo ion implantation or extension ion implantation is performed from an oblique direction. Herein, since the semiconductor layers 18 in both ends do not have a semiconductor layer at a position opposite to one side surface, the amount of bounding ions from other semiconductor region decreases during the ion implantation. In contrast, the semiconductor layer 38 sandwiched between the semiconductor layers 18 has semiconductor layers in both sides, so that the amount of bounding ions increases during the ion implantation. Thus, in the step of ion implantation from an oblique direction, there is a difference in the amount of implanted ions between the semiconductor layer 18 and the semiconductor layer 38, so that uniform transistor properties cannot be achieved.

Generally, as shown in FIG. 1(*b*), a contact with a gate electrode is formed on the gate electrode 22 on the substrate. In a semiconductor device having such a structure, since there is a difference in height between the upper surface of the semiconductor layer 38 and the gate electrode 6, when a contact with source/drain regions and a gate contact are formed at the same time, alignment in forming the contact with the gate electrode and an interconnection may require advanced techniques.

In the process for manufacturing a semiconductor device described in Japanese Patent Laid-open No. 2002-118255, there is formed a semiconductor layer 28 in one end which is in the substantially same level as a semiconductor layer where a channel region is to be formed (FIG. 2), and on the semiconductor layer, a contact with the gate electrode 6 is formed. In this manufacturing process for a semiconductor device, the steps of forming a contact and an interconnection can be made reliable, but a contact is formed on the source/drain regions in the opposite semiconductor layer 26 and the opposite semiconductor layer 26 acts as a transistor. However, for the semiconductor layer 26, etching may not be uniformly performed due to the resist distortion and asymmetric microloading effect as described above. Furthermore, since there are problems of ununiformity in ion implantation and poor processability of a gate electrode, it may be difficult to use a transistor formed by using this semiconductor layer 26 as a transistor having similar properties to the transistor formed by using the semiconductor layer 29.

In the manufacturing process for a semiconductor device described in Japanese Patent Laid-open No. 2003-229575, an additional step for removing an unnecessary semiconductor region must be added, leading to a complicated process. In the manufacturing process for a semiconductor device described in Japanese Patent Laid-open No. 2003-229575, since an unnecessary semiconductor region is removed before forming a gate electrode, in the steps after forming of the gate electrode, focus offset or asymmetric microloading effect may not be prevented, leading to gate length irregularity due to these effects. Furthermore, uniformity in halo ion implantation or extension ion implantation may be deteriorated.

In view of the above problems, an objective of the present invention is to improve uniformity in etching of a semiconductor layer where a channel region is to be formed and to improve processability and flatness of a gate electrode and uniformity in ion implantation by producing a semiconductor device having a transistor for applying current to the channel region in a semiconductor layer sandwiched between the end semiconductor layers among a plurality of semiconductor layers.

Another objective is to provide a semiconductor device having an MISFET exhibiting excellent device operation properties and reliability.

For solving the above problems, the present invention is characterized in the following aspects. Specifically, the present invention relates to a semiconductor device comprising a first semiconductor region and a second semiconductor region, (a) wherein a field effect transistor is comprised of the first semiconductor region comprising at least one semiconductor layer(s) protruding upward from a substrate, a gate electrode(s) formed via an insulating film such that the gate electrode(s) strides over the semiconductor layer(s) and source/drain regions provided in the semiconductor layer(s) on both sides of the gate electrode(s) whereby a channel region is formed in at least both sides of the semiconductor layer(s), (b) wherein the second semiconductor region comprises semiconductor layers protruding upward from the substrate and placed at least opposing the first semiconductor region at both ends in the direction perpendicular to a channel current direction and the side surface of the semiconductor layers facing the first semiconductor region is parallel to the channel current direction.

The present invention also relates to a process for manufacturing a process for manufacturing a semiconductor device, comprising the steps of:

forming fin-type semiconductor layers for forming a first semiconductor region comprising at least one semiconductor layer(s) protruding upward from a substrate and a second semiconductor region comprising semiconductor layers protruding upward from the substrate at least in both sides sandwiching the first semiconductor region; and forming a transistor by forming a gate electrode(s) striding over the semiconductor layer(s) in the first semiconductor region, an insulating film between the gate electrode(s) and at least both side surfaces of the semiconductor layer(s) and source/drain regions in both sides sandwiching the gate electrode(s) in the semiconductor layer(s).

As used herein, the first semiconductor region denotes a set of semiconductor layer(s), among a plurality of semiconductor layers formed on a substrate where channel current flows, which is not placed in the both ends in a direction perpendicular to the channel current direction. The second semiconductor region denotes a set of semiconductor layers, among a plurality of semiconductor layers formed on a substrate where channel current does not flow, which is placed in the both ends or optionally interposed in the first semiconductor region in a direction perpendicular to the channel current direction.

In the present invention, distortion of a semiconductor layer sandwiched between semiconductor layers in the both ends during forming the semiconductor layers can be prevented to provide a semiconductor with higher reliability and excellent device properties by forming semiconductor layers where channel current does not flow in the both ends (a second semiconductor region) among a plurality of semiconductor layers. For example, when semiconductor layers are formed by etching using a resist mask, resist mask tilting between the end resist masks can be effectively prevented and symmetry in microloading effect during etching semiconductor layers sandwiched between the end semiconductor layers can be maintained. As a result, semiconductor layers can be uniformly etched, to provide a semiconductor device exhibiting excellent device properties.

In the present invention, processability and flatness in a gate electrode can be improved, to provide a semiconductor device having a transistor with higher operation stability. For example, when a gate electrode is formed by etching using a resist mask, the resist mask can be formed such that it extends from semiconductor layers in a first semiconductor region to semiconductor layers in the both ends (a second semiconductor region), to prevent focus offset due to a bump during exposure of the resist mask and maintain symmetry in microloading effect.

Since semiconductor layers surrounded by the end semiconductor layers can be under the same oblique ion implantation conditions in the present invention, uniformity in oblique ion implantation can be improved, to provide a semiconductor device having a transistor exhibiting excellent operation stability.

In the present invention, separate source/drain regions and a separate gate electrode can be formed for each of the plurality of semiconductor layers in the first semiconductor region, to provide a semiconductor device with a higher integration density.

In the present invention, a gate electrode can be formed such that it strides over at least two of the plurality of semiconductor layers in the first semiconductor region, to provide a semiconductor device exhibiting excellent device stability and design freedom.

In the present invention, there can be formed on a substrate a connecting semiconductor layer which extends in a direction perpendicular to a channel current and electrically commonly connects source/drain regions sandwiching at least two of the plurality of semiconductor layers in the first semiconductor region, to facilitate alignment of a contact hole over the source/drain regions, resulting in a simpler process. Such source/drain regions sharing can lead to reduction in a parasitic resistance, a large channel width with a smaller area and thus higher integration.

In the present invention, semiconductor layers in the second semiconductor region are formed in both sides of the plurality of semiconductor layers and between the plurality of semiconductor layers in the first semiconductor region, so that mutual contact between gate electrodes can be prevented to provide a semiconductor device exhibiting excellent operation properties. Furthermore, flatness in a gate electrode can be also improved.

In the present invention, semiconductor layers within the first semiconductor region and the second semiconductor region can be arranged at regular intervals, to provide a highly reliable semiconductor device exhibiting excellent device properties.

In the present invention, a gate electrode can extend from the semiconductor layers in the first semiconductor region to the semiconductor layers in the second semiconductor region and a contact with the gate electrode can be formed on the second semiconductor region, to allow for stable contact and thus to provide a semiconductor device exhibiting excellent device properties. Furthermore, flatness in a gate electrode can be also improved.

In the present invention, the semiconductor layers in the first semiconductor region can be substantially cuboid to provide a semiconductor device exhibiting excellent operation properties and device stability.

In the present invention, the length of the semiconductor layers in the second semiconductor region can be a gate length or longer, to maintain symmetry in microloading effect, allow for processing into a desired shape and to provide a semiconductor device exhibiting excellent operation stability and device properties.

In the present invention, the width of the source/drain regions in the semiconductor layers in the first semiconductor region can be increased to facilitate alignment of a contact and to provide a semiconductor device exhibiting excellent operation stability. Furthermore, a parasitic resistance can be reduced.

DETAILED DESCRIPTION OF THE INVENTION

Semiconductor Device

In a semiconductor device of the present invention, it has a first semiconductor region and second semiconductor region in both sides of the first semiconductor region in a direction perpendicular to a channel current direction and a channel region is formed at least a side surface of a semiconductor layer in the first semiconductor region.

Figure 1:
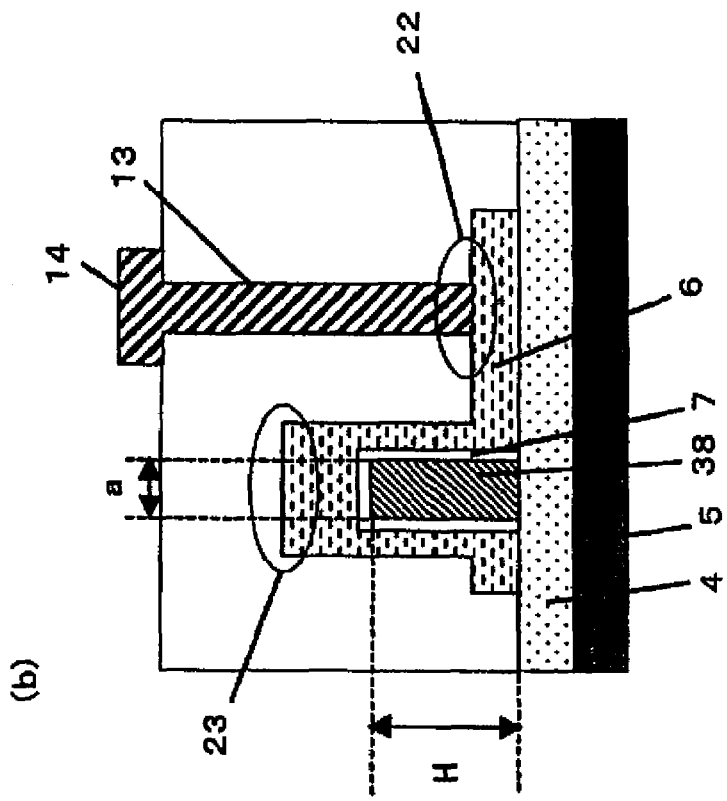
FIG. 1 is a schematic view of a semiconductor device according to the related art.
Figure 1:
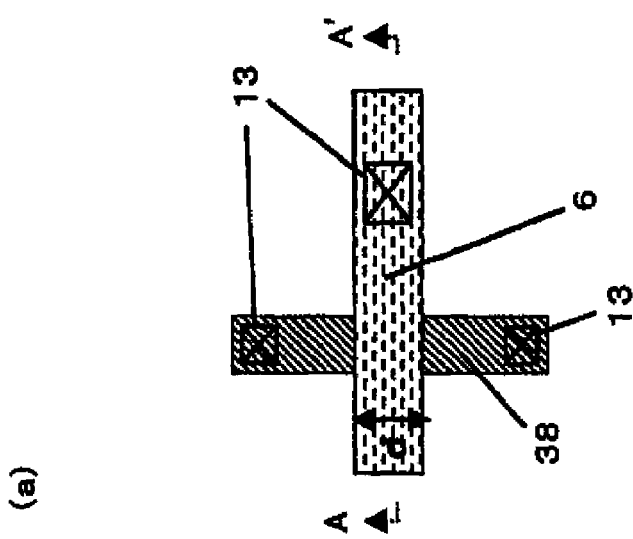
Figure 2:
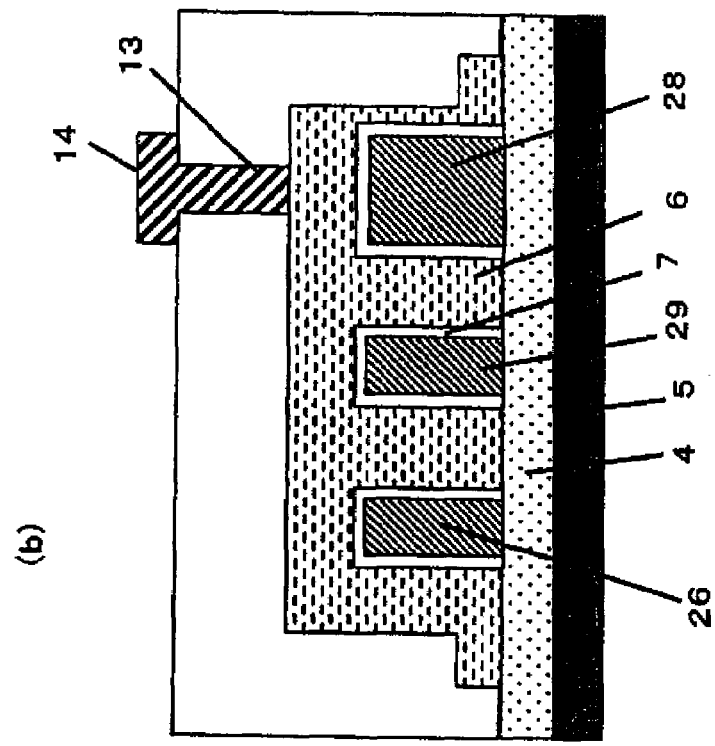
FIG. 2 is a schematic view of a semiconductor device according to the related art.
Figure 2:
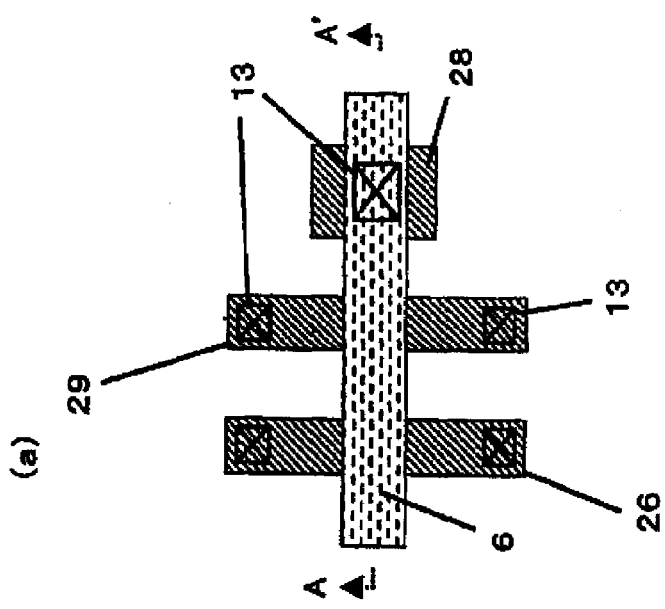
Figure 3:
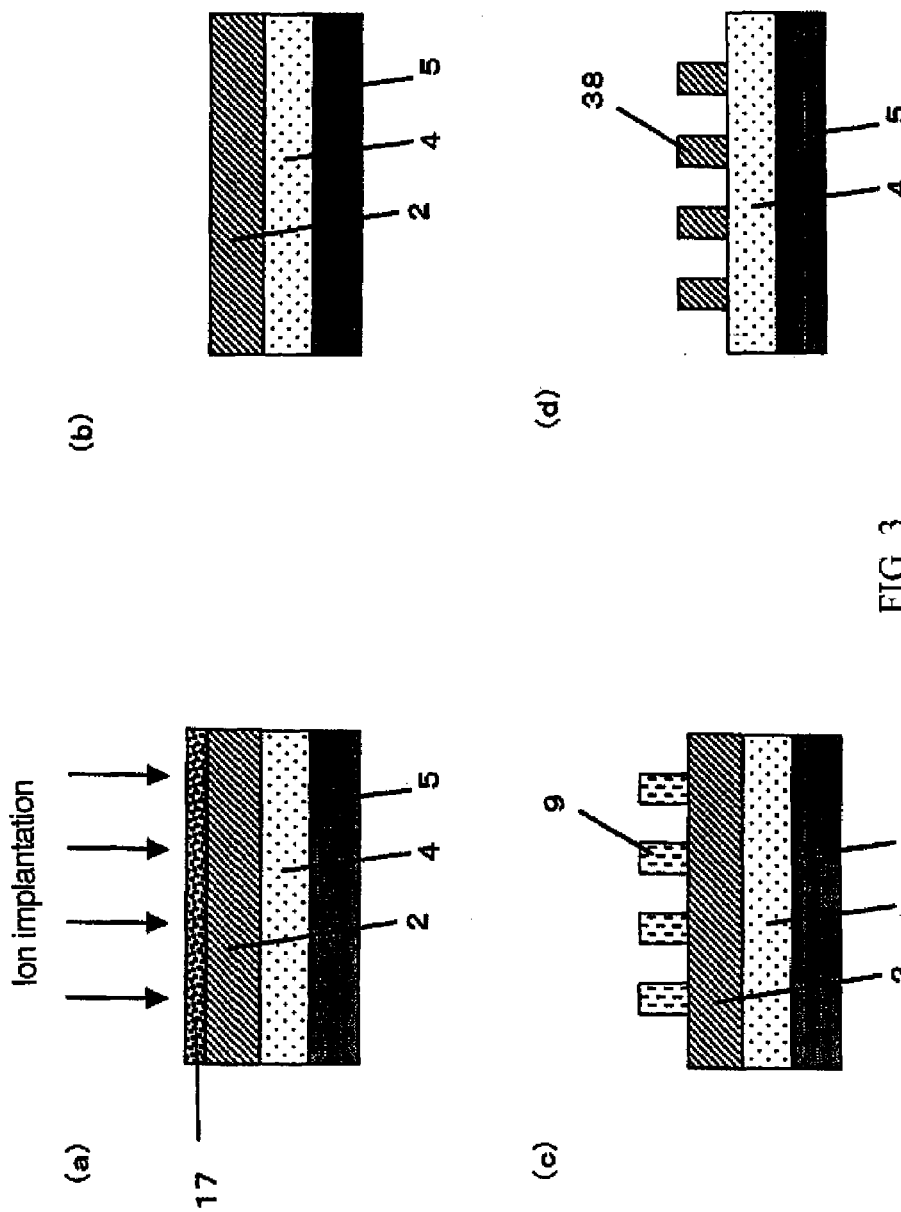
FIG. 3 illustrates a manufacturing process for a semiconductor device according to the related art.
Figure 4:
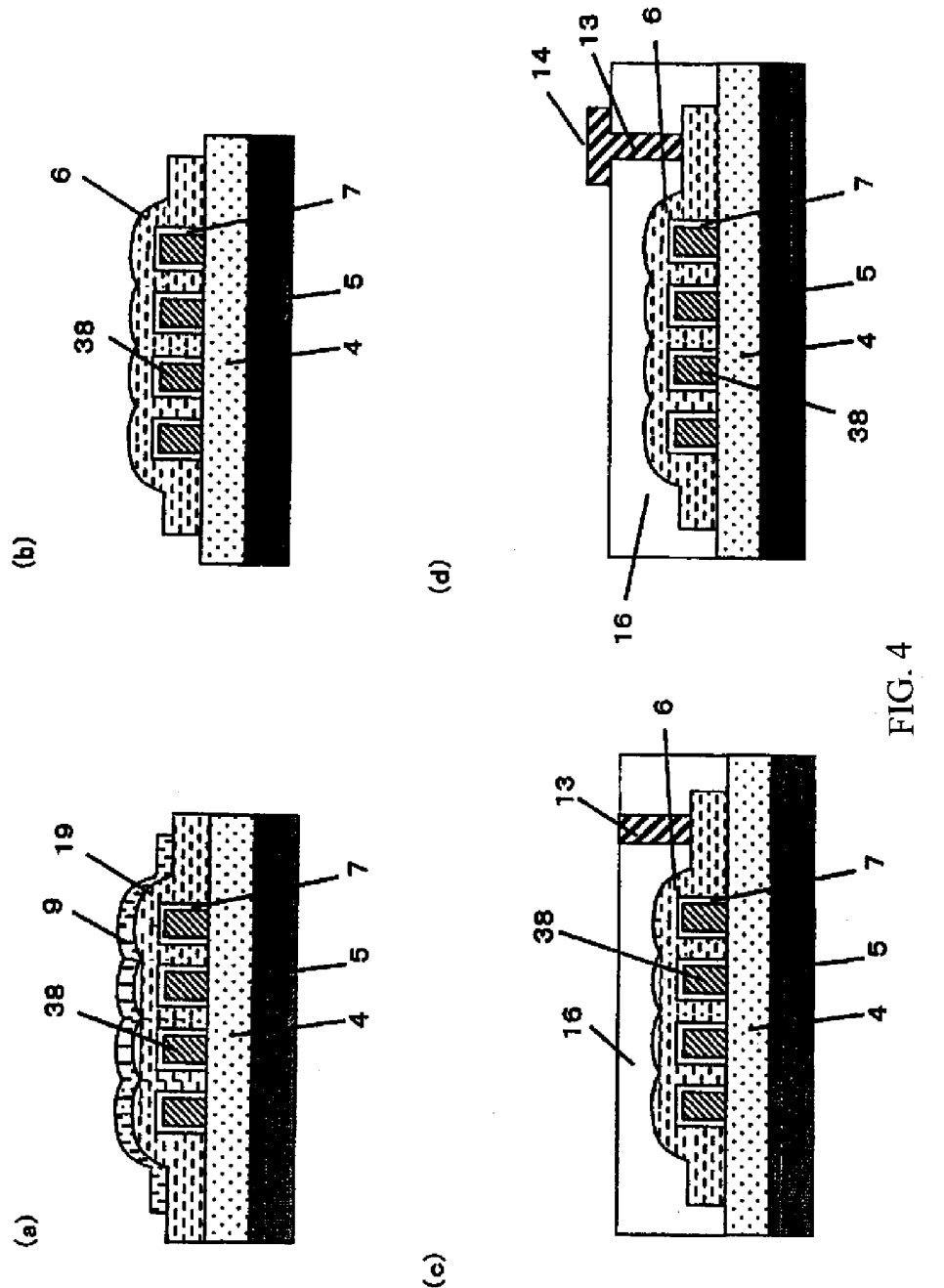
FIG. 4 illustrates a manufacturing process for a semiconductor device according to the related art.
Figure 5:
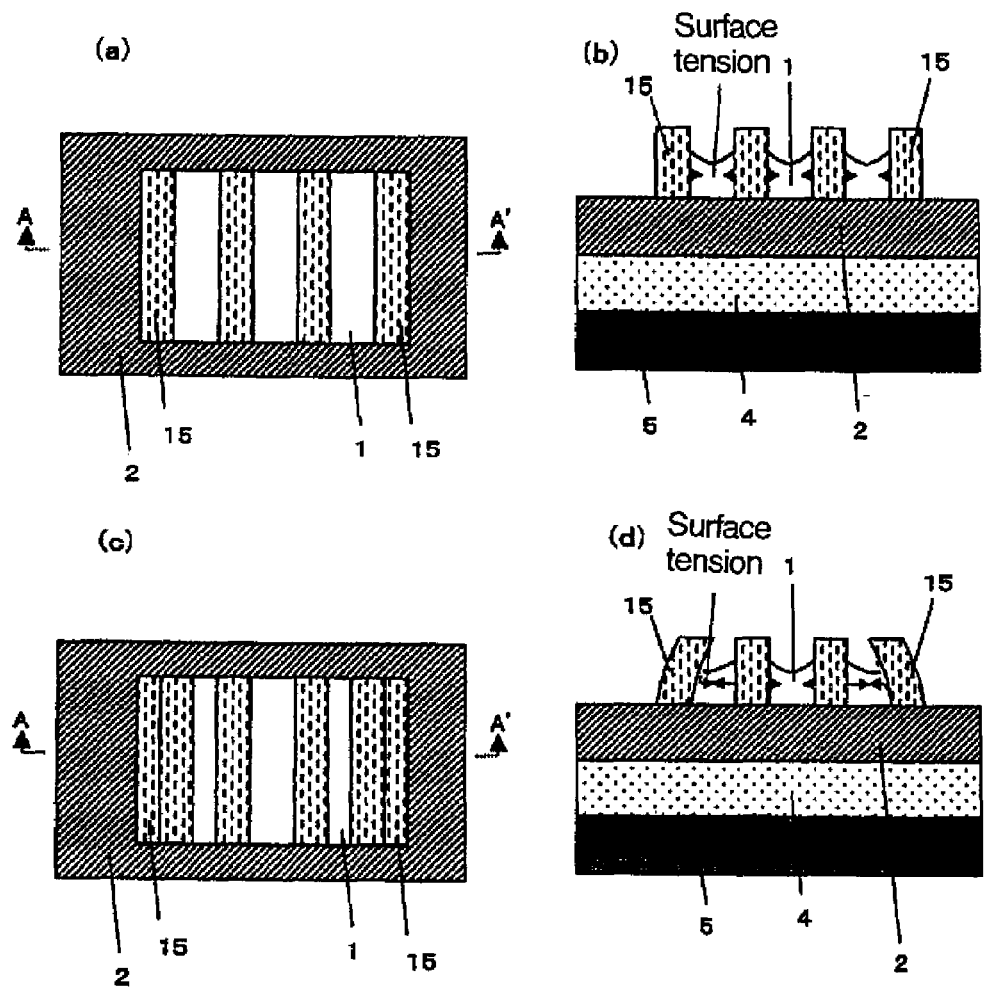
FIG. 5 illustrates a manufacturing process for a semiconductor device according to the related art.
Figure 6:
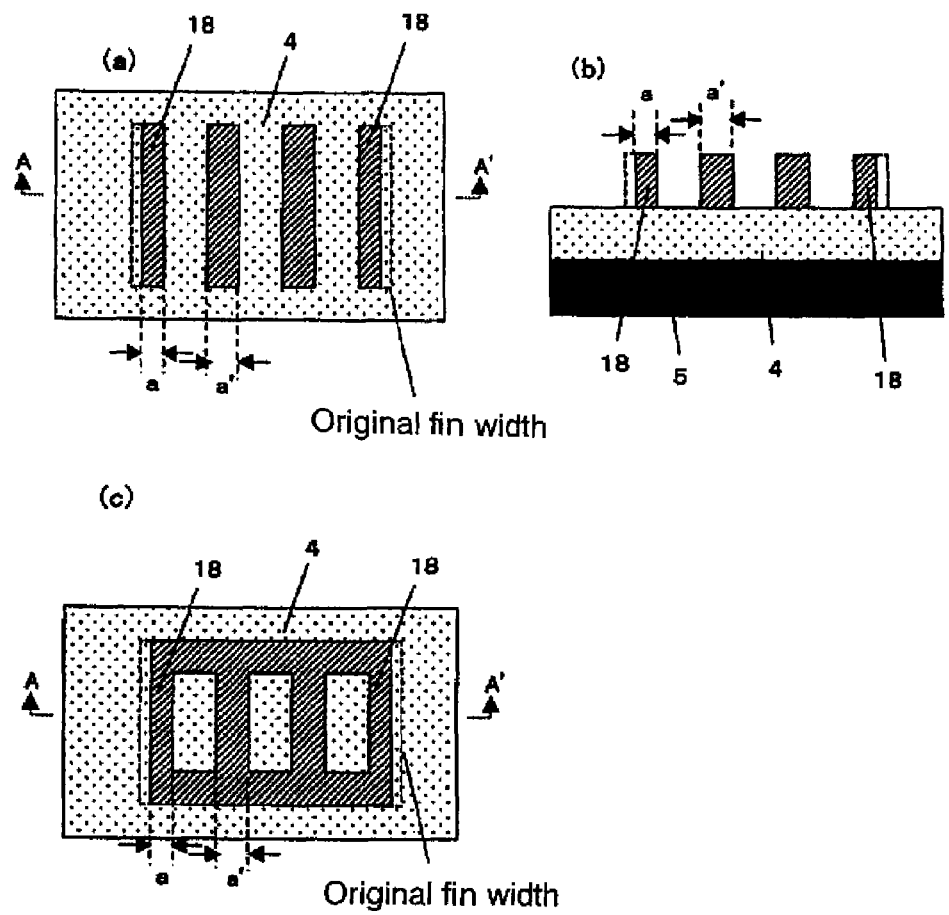
FIG. 6 illustrates a manufacturing process for a semiconductor device according to the related art.
Figure 7:
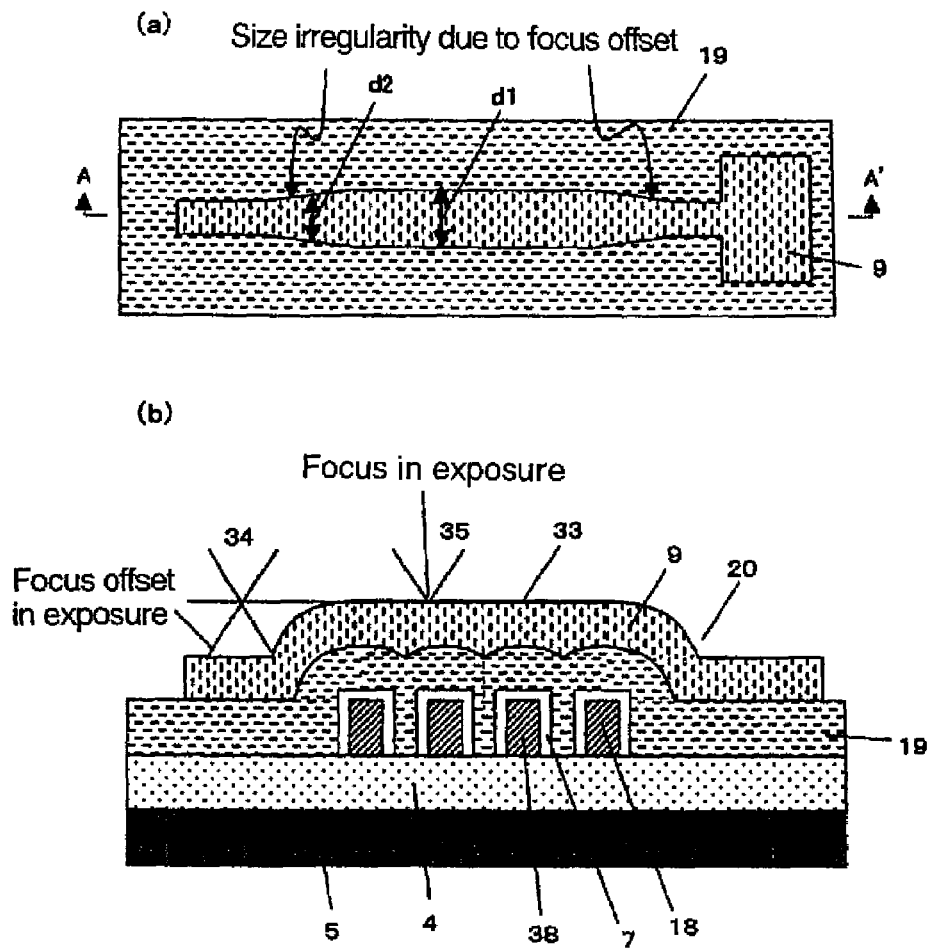
FIG. 7 illustrates a manufacturing process for a semiconductor device according to the related art.
Figure 8:
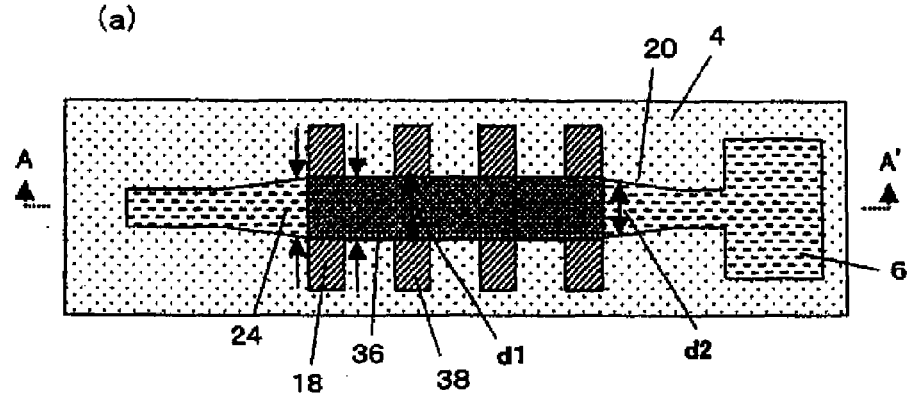
FIG. 8 illustrates a manufacturing process for a semiconductor device according to the related art.
Figure 8:
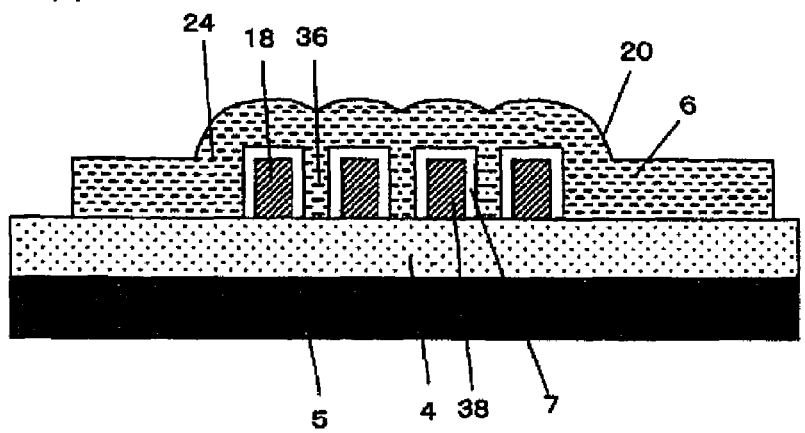
Figure 9:
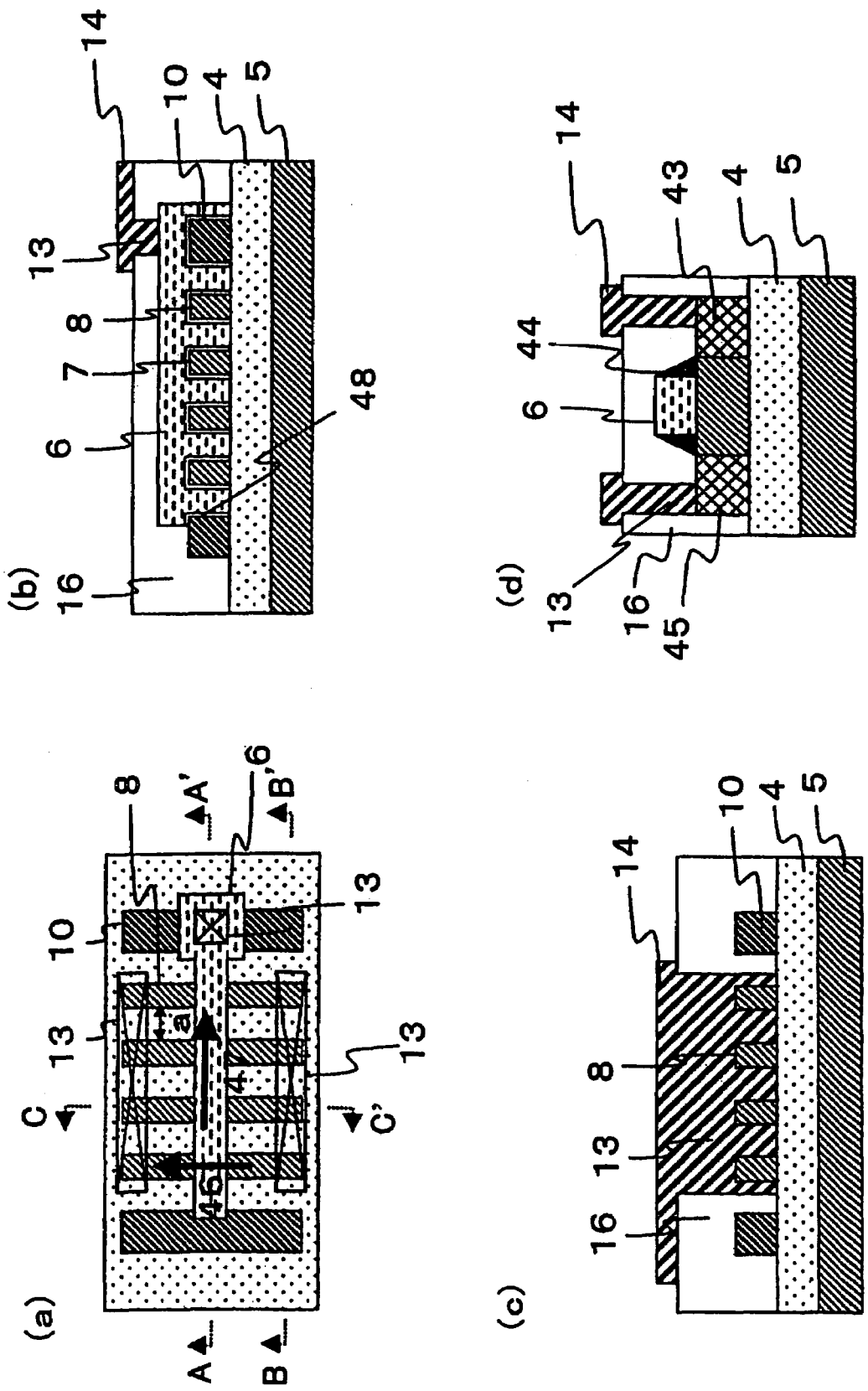
FIG. 9 shows an example of a semiconductor device according to the present invention.

FIG. 9 shows an example of a semiconductor device according to the present invention. FIG. 9(a) is a plan view of a semiconductor device having a plurality of semiconductor layers 8 as the first semiconductor region. FIG. 9(b) is a cross-sectional view taken on line A-A' of FIG. 9(a); FIG. 9(c) is a cross-sectional view taken on line B-B' of FIG. 9(a); and FIG. 9(d) is a cross-sectional view taken on line C-C' of FIG. 9(a) (FIG. 9(a) does not show an interlayer insulating film 16 or an interconnection 14. In addition, FIGS. 9(a) to (c) do not show a gate sidewall 44).

This semiconductor device is formed using an SOI substrate, and on a silicon substrate 5 is formed a buried insulating film 4, semiconductor layers 8 in a first semiconductor region protruding upward from the buried insulating film 4 and semiconductor layers 10 in a second semiconductor region. Here, a contact is formed on a source/drain regions in the semiconductor layer 8 and the semiconductor layer 8 acts as a transistor for applying a current to a channel region, but a channel current is not applied to the semiconductor layer 10. Application of a channel current to the semiconductor layer 10 can be prevented, for example, when any contact is not formed at least one region of source/drain regions in the semiconductor layer 10; or when a contact is formed on source/drain regions, but an interconnection is not electrically connected or an interconnection electrically connected to the source/drain regions are grounded or connected to a voltage source at the same potential.

In a plurality of aligned semiconductor layers (the semiconductor layers 8 and 10), the second semiconductor region are formed such that they sandwich at least one or more semiconductor layer (the semiconductor layers 8 in the first semiconductor region) on both sides.

The number of the semiconductor layers 8 can be any number without any particular restrictions as long as it is at least one or more. When forming a plurality of semiconductor layers 8, it is preferable that they are aligned such that directions of channel currents flowing through the individual semiconductor layers 8 are parallel to each other. Here, a channel region is formed on the upper surface and the side surface of the semiconductor layer 8, and a channel current flows between a drain region 45 and a source region 43 formed in the semiconductor layer as illustrated in 46 in FIG. 9(a) and FIG. 9(d). Since the source/drain regions are formed in an area in the semiconductor layer 8, which is not covered by a gate electrode, a direction of this channel current is perpendicular to the extension direction of the gate electrode. Furthermore, it is parallel to the substrate and perpendicular to an alignment direction of the semiconductor layers 8 and 10.

The semiconductor layers 8 have a side surface where a main channel region is to be formed. As used herein, the term, "a side surface" refers to a part which is substantially not parallel to the substrate in the semiconductor layer 8 protruding from the substrate, and a side surface may have a shape such as a rounded surface, a curved surface, a surface perpendicular to a substrate and a taper. Its shape may be a combination of two or more of these shapes. When the side surface is a curve or taper, a curvature or taper angle may be selected as desired. Both side surfaces of the semiconductor layer 8 may be symmetric or asymmetric.

In a direction 47 perpendicular to a channel current direction, the second semiconductor region is formed in both sides of the semiconductor layers 8 (the first semiconductor region). The second semiconductor region consists of the semiconductor layers 10 protruding upward from the substrate, and in FIG. 9, one semiconductor layer 10 is formed in each side of the first semiconductor region. The number of the semiconductor layers 10 in both sides may be one or more without particular limitations.

The semiconductor layers 10 in both sides may not necessarily have the same shape and may have different shapes, but the side surface 48 (the side surface opposite to the first semiconductor region) in the side of the first semiconductor region in the semiconductor layer 10 must be parallel to a channel current direction 46 (in FIG. 9(a), as an example, a channel current flows in the direction of the arrow 46. Depending on an arrangement of interconnections, a channel current may flow in the opposite direction to the arrow 46). Since the side surfaces 48 are parallel, a semiconductor device having a desired shape and exhibiting good processability can be obtained. There are no particular restrictions to the shapes of the side surfaces 48 as long as the side surfaces 48 are mutually parallel, and for example, their shapes may be similar to the side surface of the semiconductor layer 8. Furthermore, the semiconductor layer 10 does not adversely affect forming of the semiconductor layer 8. The side surface opposite to the side surface 48 in the semiconductor layers in the second semiconductor region may have any shape without particular limitations such as a taper, a rounded shape and a shape perpendicular to the substrate. In the semiconductor layer 10, source/drain regions may or may not be formed.

The intervals "a" between the semiconductor layers 8 are preferably equal. For the semiconductors 10 formed in both sides in the first semiconductor region, a distance between one semiconductor layer 10 and a semiconductor layer 8 facing the layer is preferably equal to a distance between the other semiconductor layer 10 and semiconductor layer 8 facing the layer. More preferably, all intervals between the semiconductor layers (the semiconductor layers 8 and 10) are preferably equal. Thus, when intervals between semiconductor layers are equal, a process such as ion implantation and etching for forming source/drain regions can be uniformly performed, to provide a semiconductor device exhibiting excellent device properties and higher reliability.

In FIG. 9, a gate electrode 6 extends from one semiconductor layer 10 to the other semiconductor layer 10, and is commonly electrically connected with them. There is formed a gate insulating film 7 between a gate electrode 6 and each semiconductor layer 8. The gate electrode 6 may be of any type as long as it strides over at least one semiconductor layer 8 and may be formed in any number without limitations.

Furthermore, the gate electrode 6 may be formed, extending over the semiconductor layers 8 in the first semiconductor region as shown in FIG. 9 or extending over from the semiconductor layers 8 to the semiconductor layers 10 in the second semiconductor region. Here, the gate electrode 6 may be formed, extending over at least part of the upper surface of the semiconductor layer 10, but may not be necessarily formed such that it strides over the entire semiconductor layer 10. Thus, when the gate electrode 6 extends over the upper surface of the semiconductor layers 10, the gate electrode 6 has a highly symmetric structure over both sides of the end semiconductor layers 8 among the semiconductor layers 8 in the first semiconductor region. In other words, there is provided a structure where over both right and left sides of the semiconductor layers 8, the gate electrode extends to adjacent semiconductor layer 8 or 10. Thus, for example, when forming the gate electrode by etching using a resist mask, focus offset and asymmetry in microloading effect can be more reduced in the gate electrode over the semiconductor layers 8. Furthermore, asymmetry in oblique ion implantation can be also reduced, to provide a semiconductor device exhibiting excellent device properties.

As shown in FIG. 9(d), in an area in each semiconductor layer 8 where a gate electrode 6 is not formed, there are formed a source region 43 and a drain region 45. Channel regions are formed in the upper and the side surfaces of the semiconductor layer 8 immediately beneath the gate electrode 6, and thus the semiconductor device is a so-called triple-gate fin-type transistor. When a voltage is applied to the gate electrode 6, a channel current flows between the source region 43 and the drain region 45.

As shown in FIGS. 9(b) and (c), source/drain regions in each semiconductor layer 8 are connected to an above interconnection 14 via a common contact. Contact with a gate electrode is ensured above one semiconductor layer 10. There are no particular restrictions to a position of contact with the gate electrode, but it is preferably above the semiconductor layer 10. Thus, contact above the semiconductor layer 10 can be easily aligned and allow for stable contact, to provide a semiconductor device exhibiting excellent device properties. In the area other than the contact, there is formed an interlayer insulating film 16.

Figure 10:
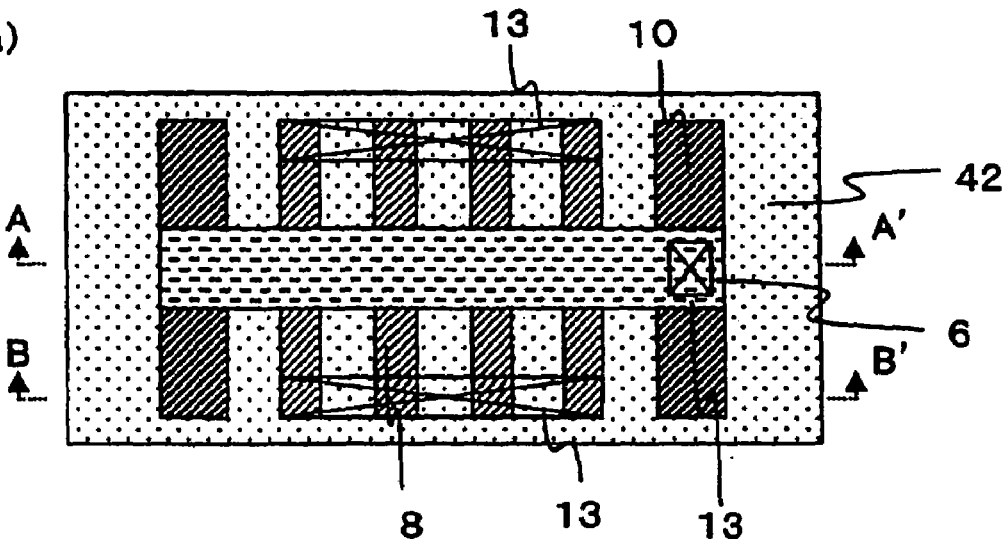
FIG. 10 shows an example of a semiconductor device according to the present invention.
Figure 10:
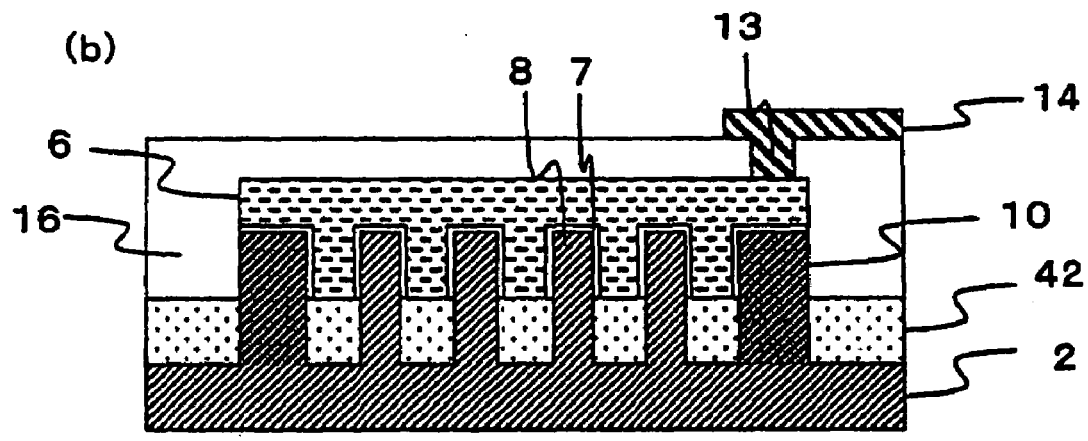
Figure 10:
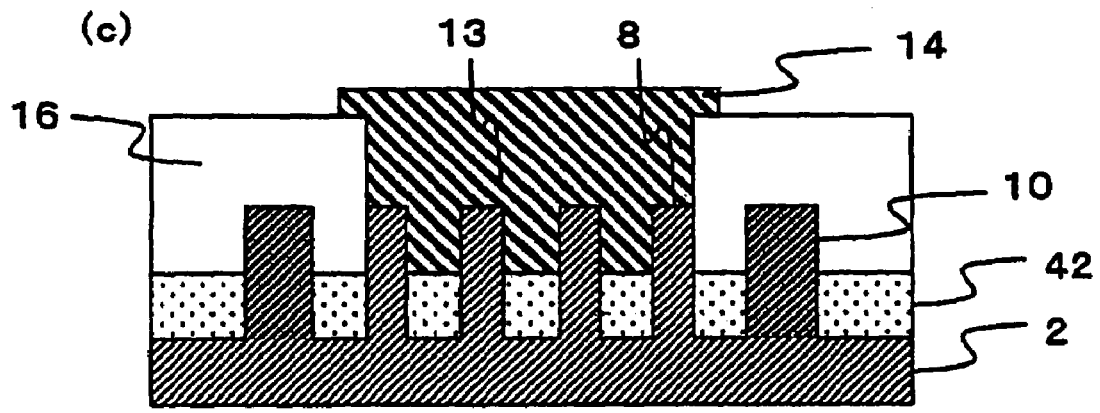

FIG. 10 shows another example of a semiconductor device according to the present invention. The semiconductor device in FIG. 10 is characterized in that the semiconductor layers 8 and 10 in the first and the second semiconductor region directly protrude from the silicon substrate 2. FIG. 10(a) is a plan view of the semiconductor device; FIG. 10(b) is a cross-sectional view taken on line A-A' of FIG. 10(a); and FIG. 10(c) is a cross-sectional view taken on line B-B' of FIG. 10(a). There is formed a separating insulating film 42 in the area other than the protruding semiconductor layers 8 and 10.

Figure 11:
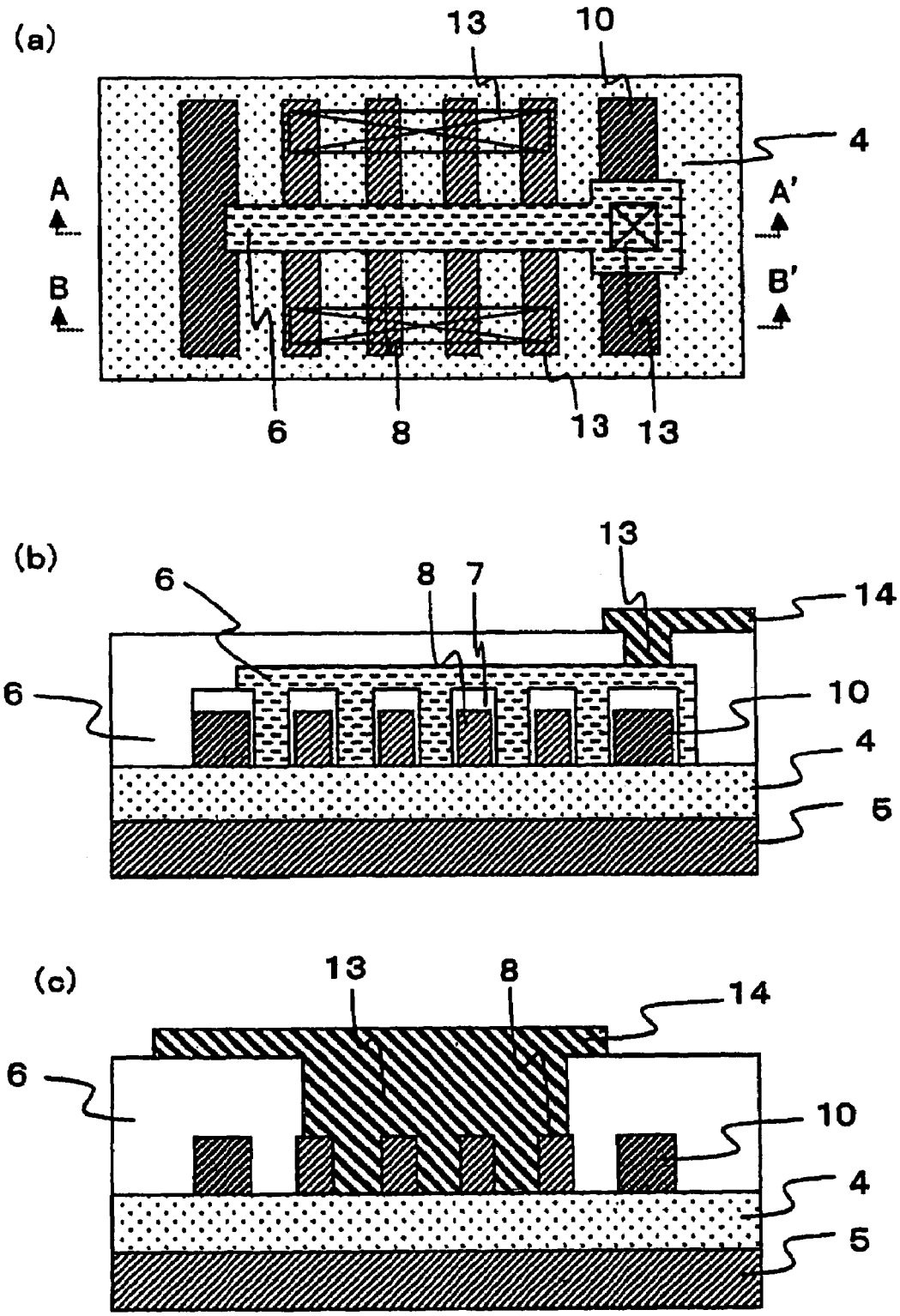
FIG. 11 shows an example of a semiconductor device according to the present invention.

FIG. 11 shows a variation of the semiconductor device in FIG. 9. FIG. 11(a) is a plan view of the semiconductor device; FIG. 11(b) is a cross-sectional view taken on line A-A' of FIG. 11(a); and FIG. 11(c) is a cross-sectional view taken on line B-B' of FIG. 11(a). In the semiconductor device in FIG. 11, the gate insulating film 7 formed on the upper surface of the semiconductor layer 8 in the first semiconductor region is thicker than that in the semiconductor device in FIG. 9. Thus, the semiconductor device is a so-called double-gate type transistor where a channel region is formed only in the side surface of the semiconductor layer 8, but not in the upper surface of the semiconductor layer 8. The gate electrode extends from one semiconductor layer 10 to a part of the upper surface of the other semiconductor layer 10.

Figure 12:
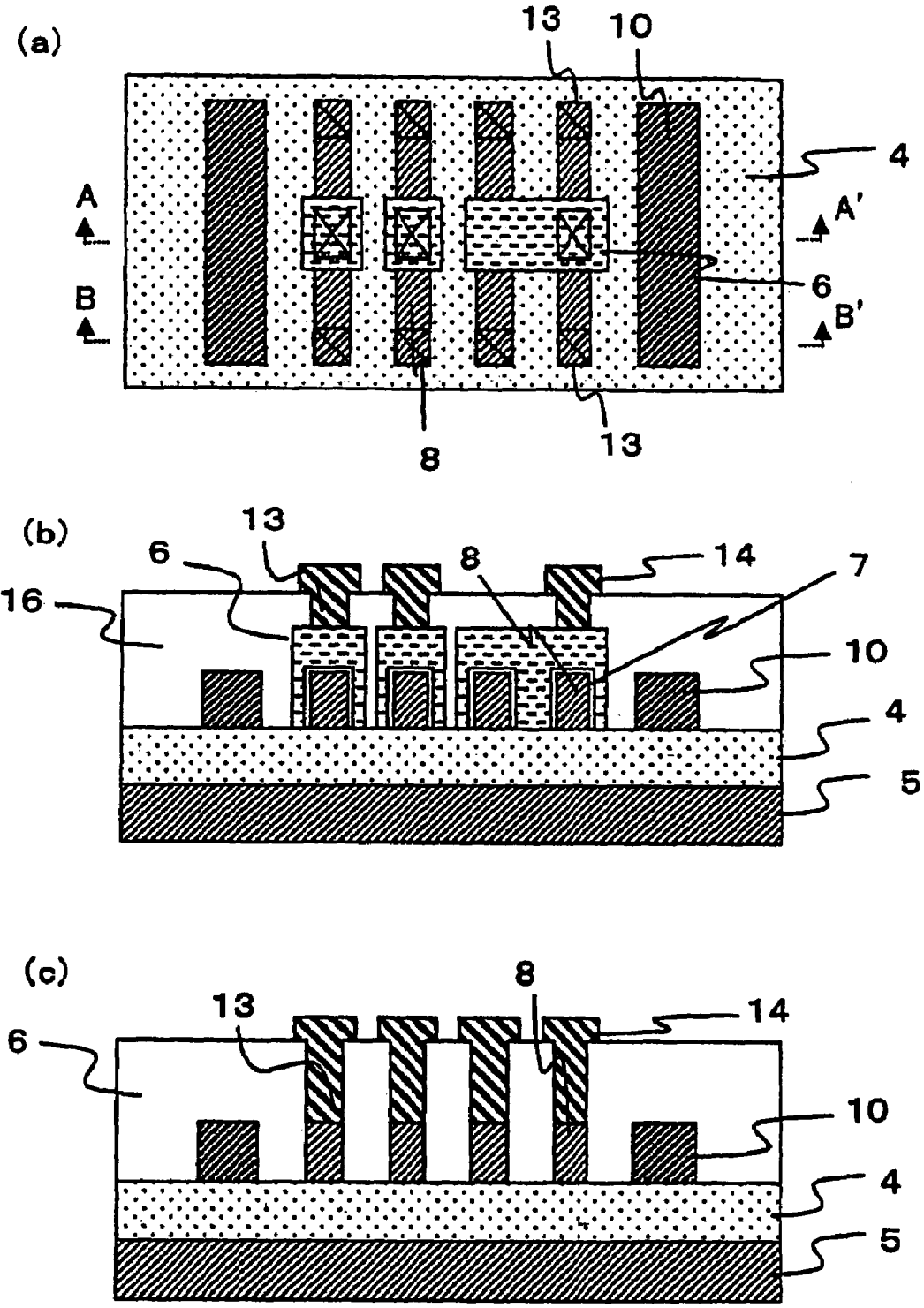
FIG. 12 shows an example of a semiconductor device according to the present invention.

FIG. 12 shows a variation of a semiconductor device in FIG. 9. FIG. 12(a) is a plan view of the semiconductor device; FIG. 12(b) is a cross-sectional view taken on line A-A' of FIG. 12(a); and FIG. 12(c) is a cross-sectional view taken on line B-B' of FIG. 12(a). In this semiconductor device, there are aligned four semiconductor layers 8 in the first semiconductor region, and separate gate electrodes 6 are formed on two of the semiconductor layers 8 (two in the left side), respectively. For the other two semiconductor layers 8 (two in the right side), there is formed a commonly electrically connected gate electrode 6 striding over these two semiconductor layers 8. There is not formed a gate electrode 6 on the semiconductor layers 10 in the second semiconductor region.

A source region and a drain region in each semiconductor layer 8 are individually connected to a separate interconnection 14 via a separate contact. A contact with each gate electrode 6 is formed over the semiconductor layer 8. For the common gate electrode 6 striding over the two semiconductor layers 8 in the right side, there is formed a contact with the gate electrode 6 over the rightmost semiconductor layer 8. These gate electrodes 6 may be connected individually to a separate interconnection or to a common interconnection.

Thus, in the semiconductor device of the present invention, there may be simultaneously present gate electrodes separately formed for individual semiconductor layers 8 in the semiconductor device and a common gate electrode striding over a plurality of semiconductor layers 8. Thus, there may be provided a semiconductor device exhibiting excellent device stability and freedom in device designing.

Figure 13:
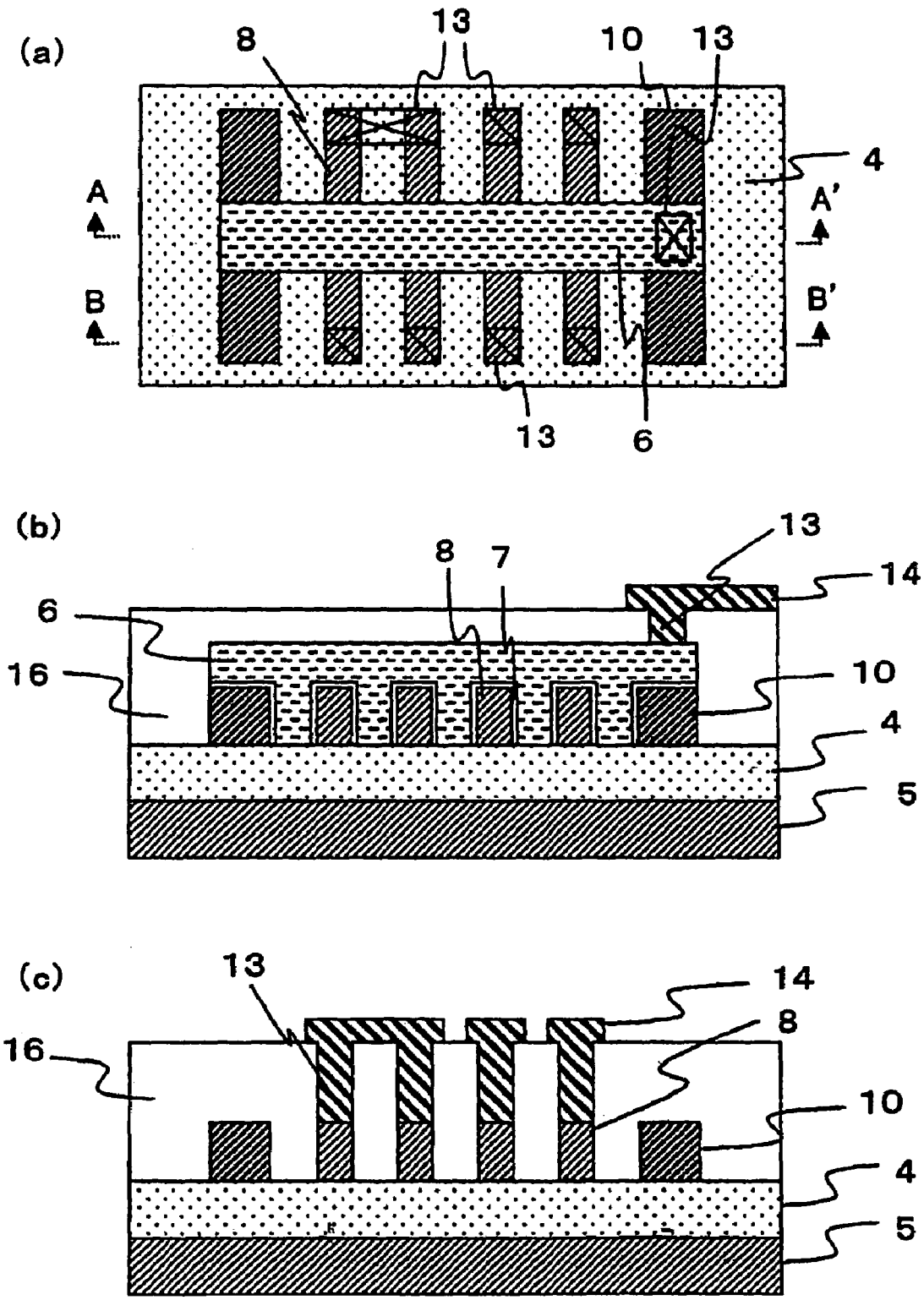
FIG. 13 shows an example of a semiconductor device according to the present invention.

FIG. 13 shows a variation of the semiconductor device in FIG. 12. FIG. 13(a) is a plan view of the semiconductor device; FIG. 13(b) is a cross-sectional view taken on line A-A' of FIG. 13(a); and FIG. 13(c) is a cross-sectional view taken on line B-B' of FIG. 13(a). In the semiconductor device in FIG. 13, the gate electrode 6 extends from one semiconductor layer 10 in the second semiconductor region to the other semiconductor layer 10 and a gate electrode is a commonly formed in contrast to the semiconductor device in FIG. 12. Thus, if necessary for a circuit configuration, a gate electrode can be commonly formed.

As shown in FIG. 13(a), in the two semiconductor layers 8 in the left side, the upper source or drain region of the source/drain regions shown has a common contact for the two semiconductor layers 8, while the other source/drain regions have a separate contact. Thus, for a plurality of contacts with source/drain regions, some may be common contacts while the others may be separate contacts. As shown in FIG. 13(c), the lower source/drain regions in each semiconductor layer 8 have a separate contact while two in the left side are connected to a common interconnection. Thus, separate contacts may be connected to each other via an interconnection as appropriate. When a plurality of semiconductor layers 8 are aligned, separate gate electrodes 6 may be formed for some semiconductor layers 8 while a common gate electrode be formed for the other semiconductor layers 8.

Figure 14:
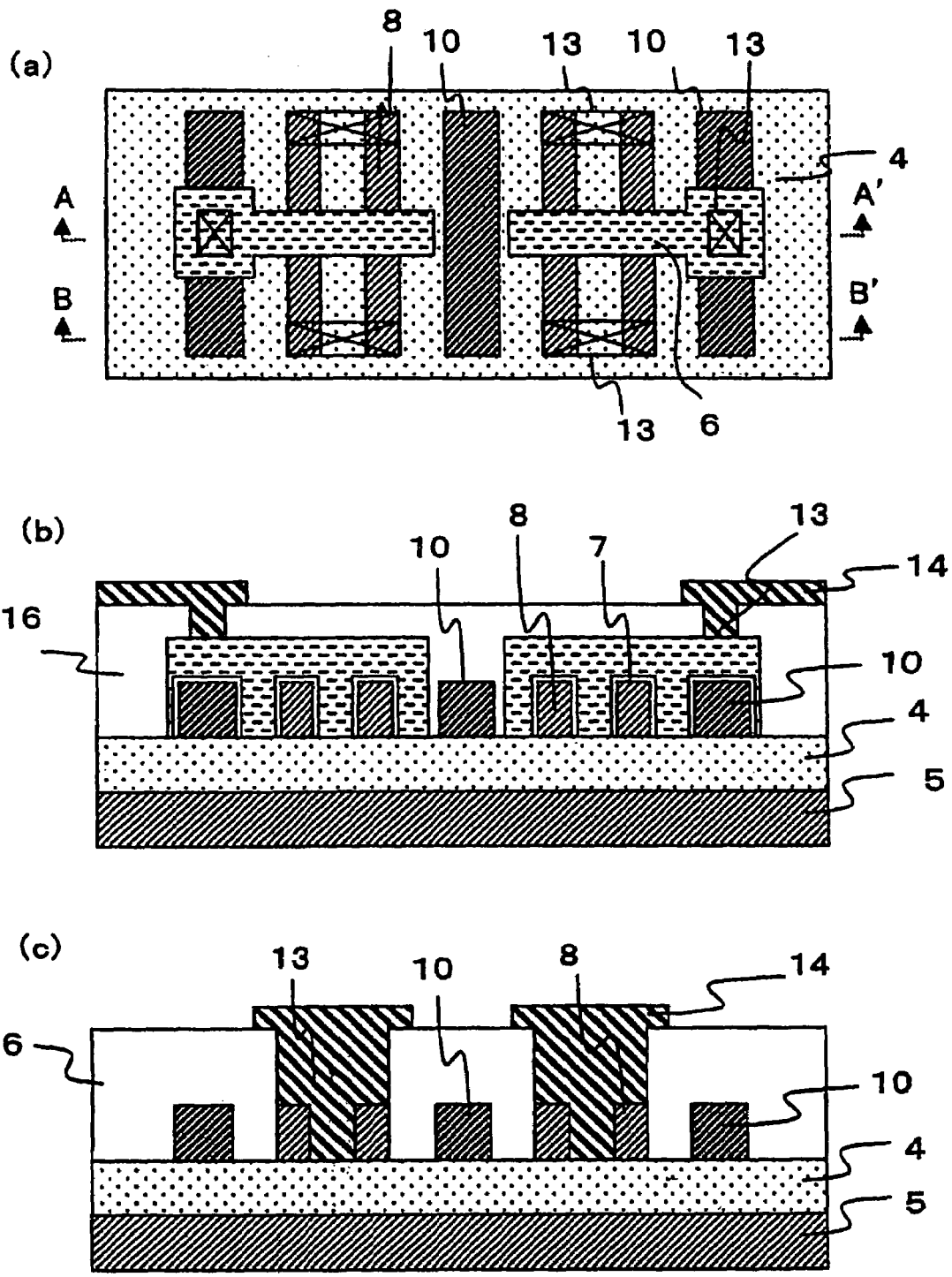
FIG. 14 shows an example of a semiconductor device according to the present invention.

FIG. 14 shows another example of a semiconductor device according to the present invention. This semiconductor device is characterized in that the semiconductor layers 10 in the second semiconductor region are formed not only in both sides of the first semiconductor region but also between the semiconductor layers 8 in the first semiconductor region. FIG. 14(a) is a plan view of this semiconductor device; FIG. 14(b) is a cross-sectional view taken on line A-A' of FIG. 14(a); and FIG. 14(c) is a cross-sectional view taken on line B-B' of FIG. 14(a). In FIG. 14, one semiconductor layer 10 is formed in each of both sides and the center of the plurality of aligned semiconductor layers 8. There are no particular restrictions to the number of the semiconductor layers 10 between the semiconductor layers 8 and two or more may be formed. Alternatively, the semiconductor layers 10 may be formed at multiple different positions between the semiconductor layers 8, or two or more semiconductor layers 10 may be formed at one position. For example, the semiconductor layers 8 and the semiconductor layers 10 may be alternately disposed in a direction perpendicular to a channel current direction. Here, the side surface of the semiconductor layer 10 formed between the semiconductor layers 8 should be parallel to the channel current direction in the semiconductor layer 8. There are no particular restrictions to the shape of the semiconductor layer 10 formed between the semiconductor layers 8, but it preferably has the same shape as the semiconductor layer 8 and is parallel to that.

In FIG. 14, two gate electrodes 6 are formed, and each gate electrode 6 strides over from one semiconductor layer 10 of the semiconductor layers 10 in both ends to two semiconductor layers 8. In this semiconductor device, the gate electrode 6 does not extend to the central semiconductor layer 10, and therefore, when forming a plurality of gate electrodes, electric contact between the gate electrodes can be prevented, to provide a semiconductor device exhibiting excellent operation properties. The gate electrode may extend to the central semiconductor layer 10. Here, it can improve structural symmetry in the gate electrode seen from the semiconductor layer 8.

Contact with the gate electrode is above each of the end semiconductor layers 10, but the contact may be above the central semiconductor layer 10.

Figure 15:
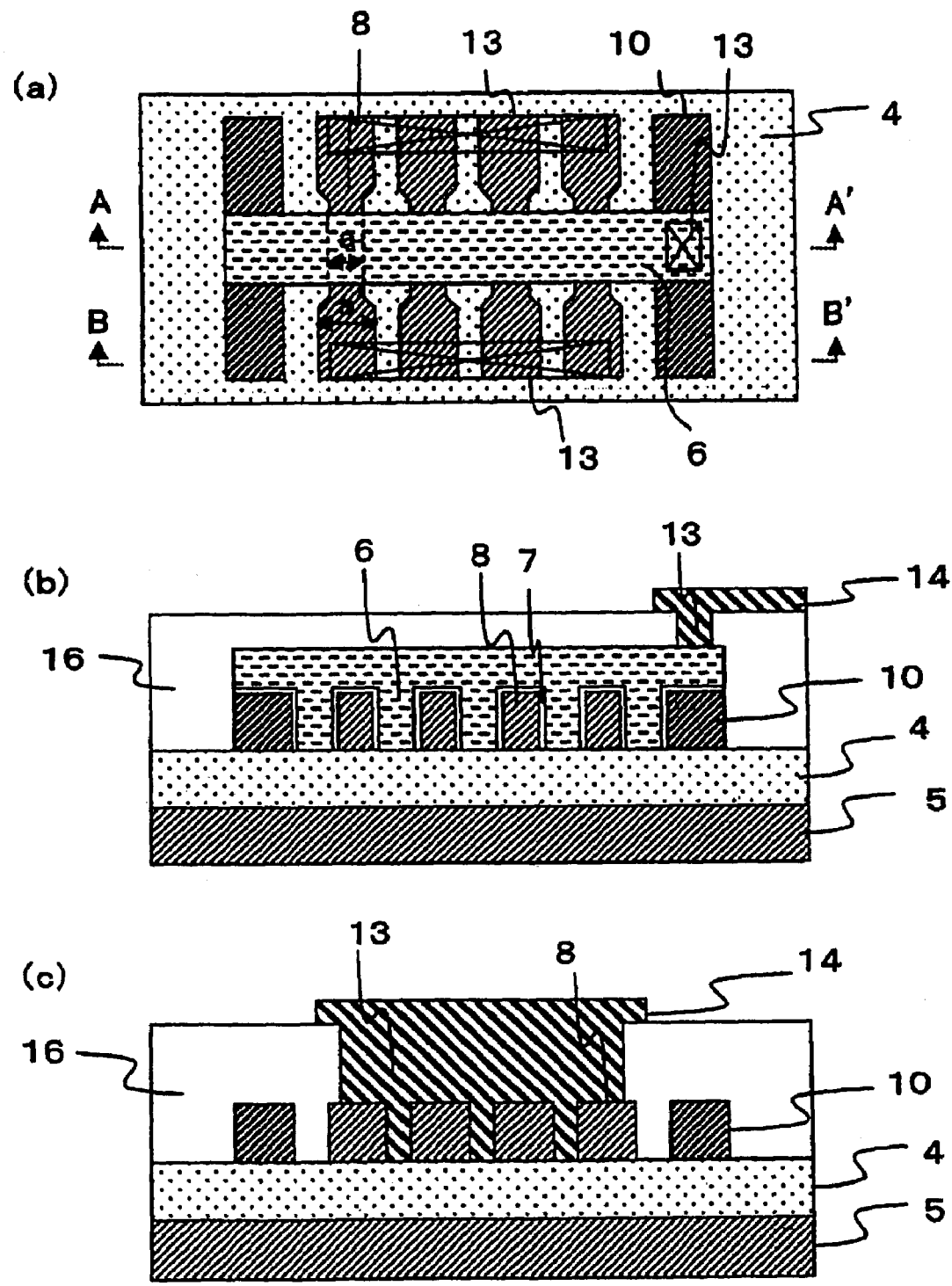
FIG. 15 shows an example of a semiconductor device according to the present invention.

FIG. 15 shows a variation of the semiconductor device in FIG. 9. FIG. 15(a) is a plan view of the semiconductor device; FIG. 15(b) is a cross-sectional view taken on line A-A' of FIG. 15(a); and FIG. 15(c) is a cross-sectional view taken on line B-B' of FIG. 15(a). This semiconductor device is characterized in that in each semiconductor layer 8 in the first semiconductor region, a width (a) of the source/drain regions (a length in a direction perpendicular to a channel current direction) is larger than a width (a') of the part in the semiconductor layer covered by the gate electrode. Thus, a large width of the source/drain regions makes contact alignment easier and provides a semiconductor device exhibiting excellent operation stability. Furthermore, a parasitic resistance can be reduced.

There are no particular restrictions to the shapes of the area covered by the gate electrode and of the source/drain regions in the semiconductor layer 8. For example, their side surfaces may be, for example, a curved or taper shape. Preferably, the shapes of the area covered by the gate electrode and of the source/drain regions may be substantially cuboid. Such a substantially cuboid shape may improve symmetry in a process, to provide a semiconductor device having stable device properties. The source region and the drain region in the semiconductor layer 8 may not have the same shape, but may mutually have difference shapes. A width of the source and drain regions in the semiconductor layer 8 is preferably 1.1 to 10 times, more preferably 2 to 5 times as large as the width of the area covered by the gate electrode.

Figure 16:
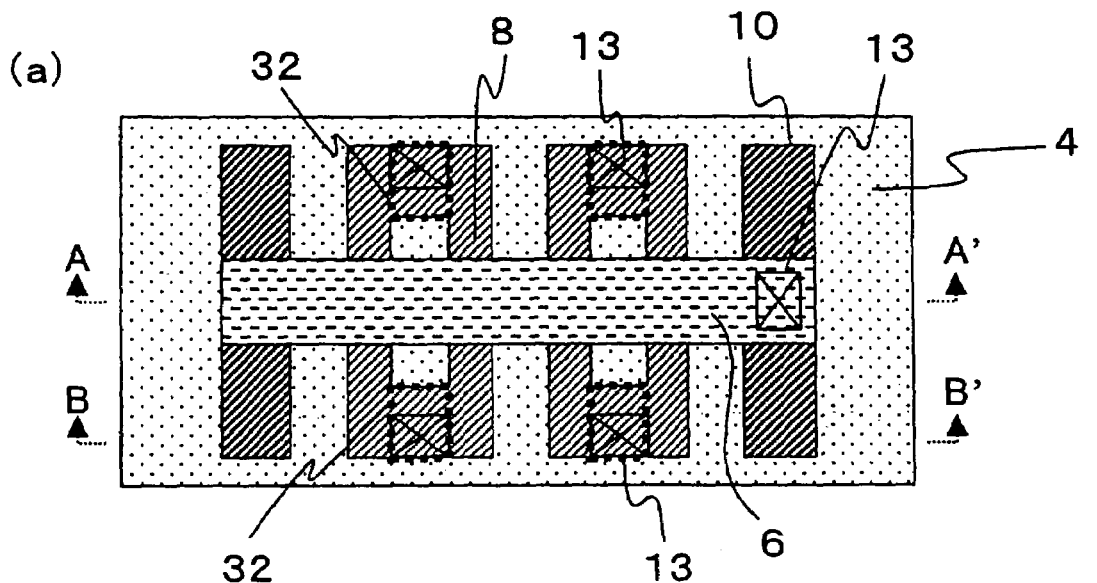
FIG. 16 shows an example of a semiconductor device according to the present invention.
Figure 16:
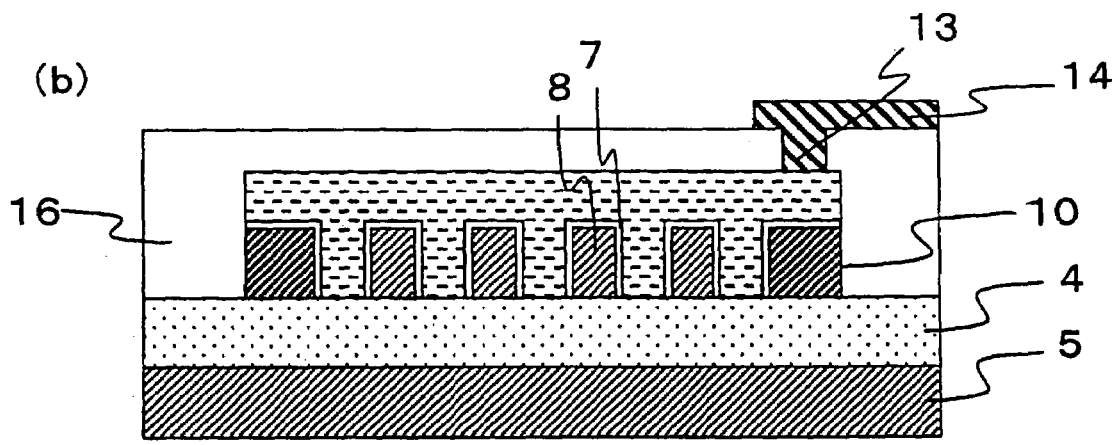
Figure 16:
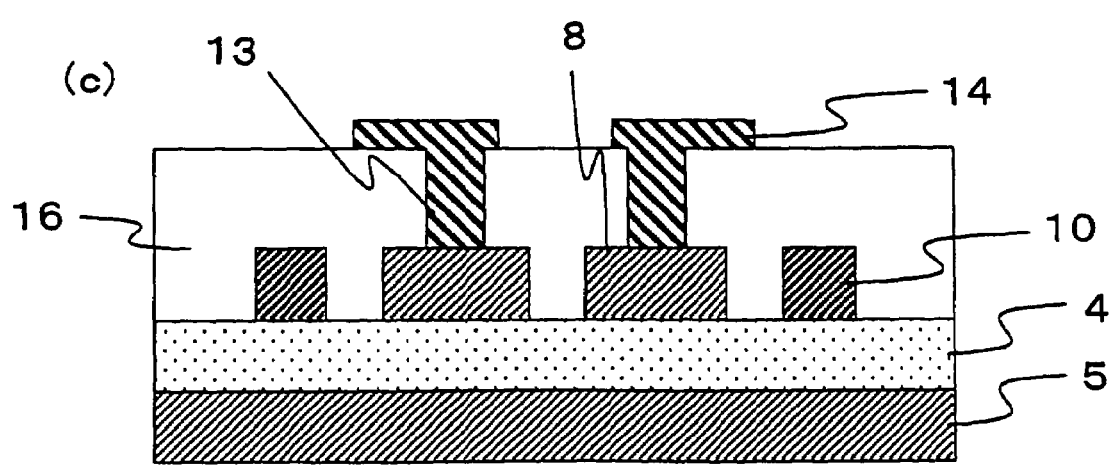

FIG. 16 shows another example of a semiconductor device according to the present invention. FIG. 16(a) is a plan view of this semiconductor device; FIG. 16(b) is a cross-sectional view taken on line A-A' of FIG. 16(a); and FIG. 16(c) is a cross-sectional view taken on line B-B' of FIG. 16(a). This semiconductor device is characterized in that there are four semiconductor layers 8 in the first semiconductor region and two of these semiconductor layers 8 are connected by a semiconductor layer 32 extending in a direction perpendicular to a channel current direction (an area enclosed by the dotted line in FIG. 16(a)) and two semiconductor layers 8 shares common source/drain regions. These two semiconductor layers 8 constitute a multiple-fin transistor. In such a semiconductor device, a contact can be easily aligned and a parasitic resistance can be reduced. In addition, a large channel width can be ensured with a smaller area, resulting in higher integration.

In the semiconductor device in FIG. 16, a contact with the source/drain regions is on a part of the source/drain regions, but a position of the contact is not limited to that in FIG. 16 and may be on any part of the source/drain regions.

Although the gate electrode 6 is formed striding from one semiconductor layer 10 in the second semiconductor region to the other semiconductor layer 10, that is, striding over all the semiconductor layers in FIG. 16, it may not extend to the end semiconductor layers 10. Furthermore, when a plurality of semiconductor layers 8 are aligned, some of the semiconductor layers 8 may have a separate source region and a separate drain region while the other semiconductor layers 8 may have common source and drain regions as shown in FIG. 16.

Figure 17:
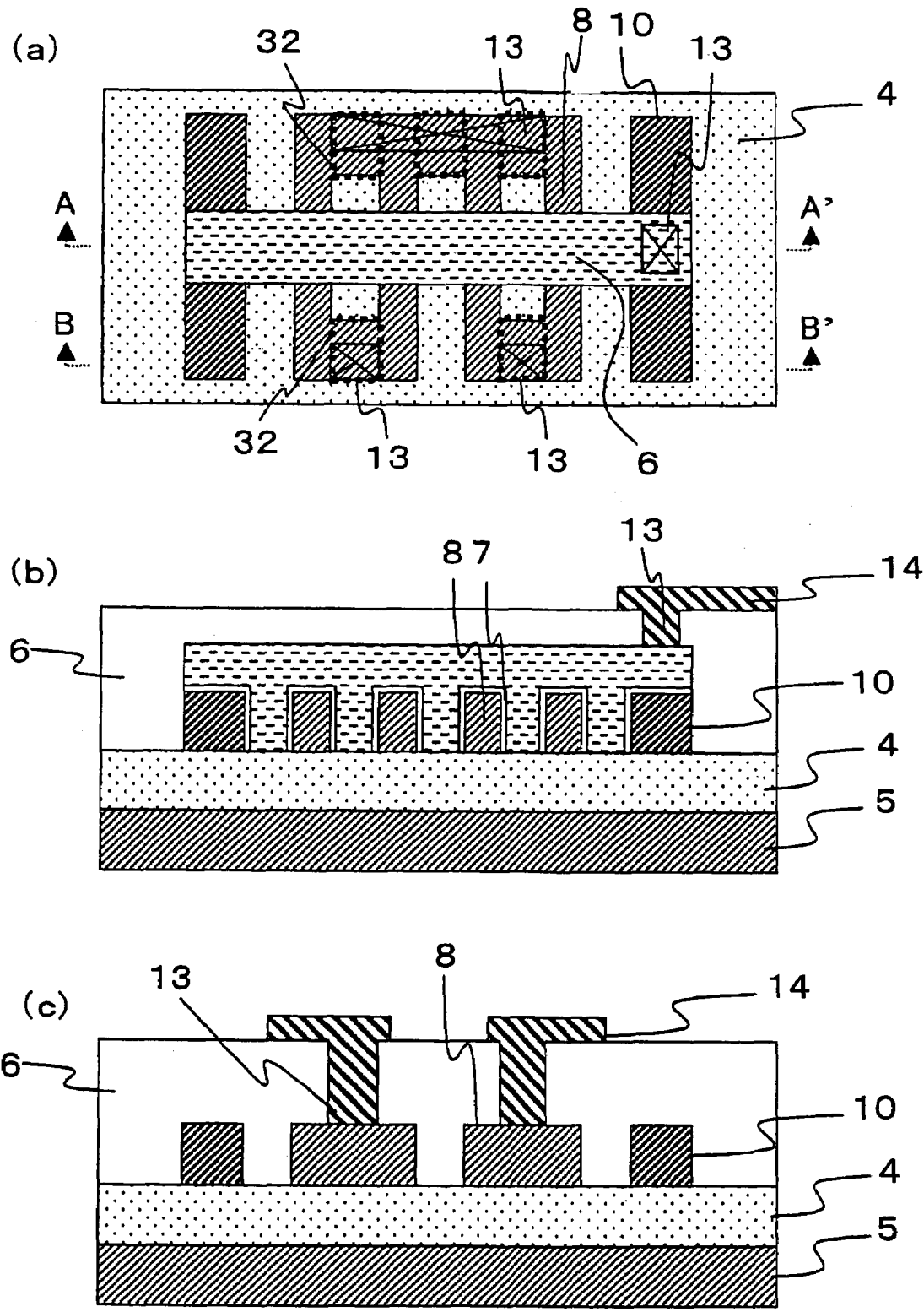
FIG. 17 shows an example of a semiconductor device according to the present invention.

FIG. 17 shows a variation of the semiconductor device in FIG. 16. FIG. 17(a) is a plan view of the semiconductor device; FIG. 17(b) is a cross-sectional view taken on line A-A' of FIG. 17(a); and FIG. 17(c) is a cross-sectional view taken on line B-B' of FIG. 17(a). The semiconductor device in FIG. 17 is characterized in that the source/drain regions in the first semiconductor region are asymmetry in a channel current direction. For example, in one region in FIG. 17, four semiconductor layers 8 are common while in the other region, two semiconductor layers 8 are common. There are no particular restrictions of the number of semiconductor layers 8 commonly sharing the source/drain regions as long as it is two or more.

Figure 18:
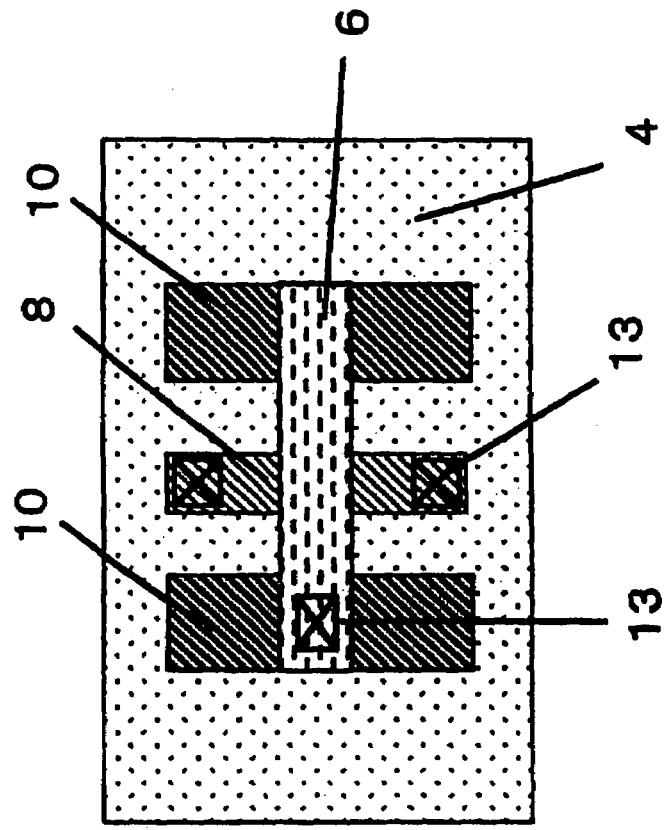
FIG. 18 shows an example of a semiconductor device according to the present invention.

FIG. 18 shows a variation of the semiconductor device in FIG. 9. FIG. 18 is a plan view of the semiconductor device. In the semiconductor device in FIG. 18, there is one semiconductor layer 8 in the first semiconductor region, and there are second semiconductor regions in both sides of the layer 8. This semiconductor device constitutes a single-fin-type transistor. For example, when such a transistor and a transistor having a plurality of semiconductor layers 8 are disposed on same substrate, etching status such as microloading effect in the semiconductor layers 8 in the semiconductor device can be in the same level and dimensional accuracy can be constant. Furthermore, uniformity in oblique ion implantation can be improved.

Figure 19:
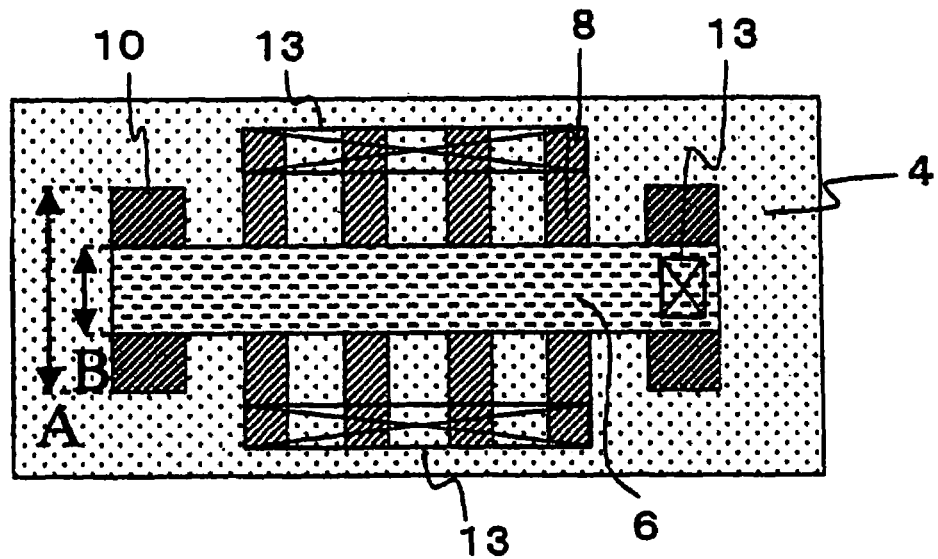
FIG. 19 shows an example of a semiconductor device according to the present invention.

FIG. 19 shows another example of a semiconductor device according to the present invention. FIG. 19 is a plan view of this semiconductor device. In the semiconductor device in FIG. 19, a length "A" of the semiconductor layer 10 in the second semiconductor region in a channel current direction is smaller than a length of the semiconductor layer 8 in the first semiconductor region, but is larger than a gate length "B". Thus, the length of the semiconductor layer 10 which is at least equal to or more than the gate length can allow symmetry in microloading effect to be maintained during etching of a part to be a channel region in the semiconductor layer 8 when forming the semiconductor layer, and thus the device can be processed into a desired shape. Thus, there can be provided a semiconductor device exhibiting excellent operation stability and device properties.

Figure 20:
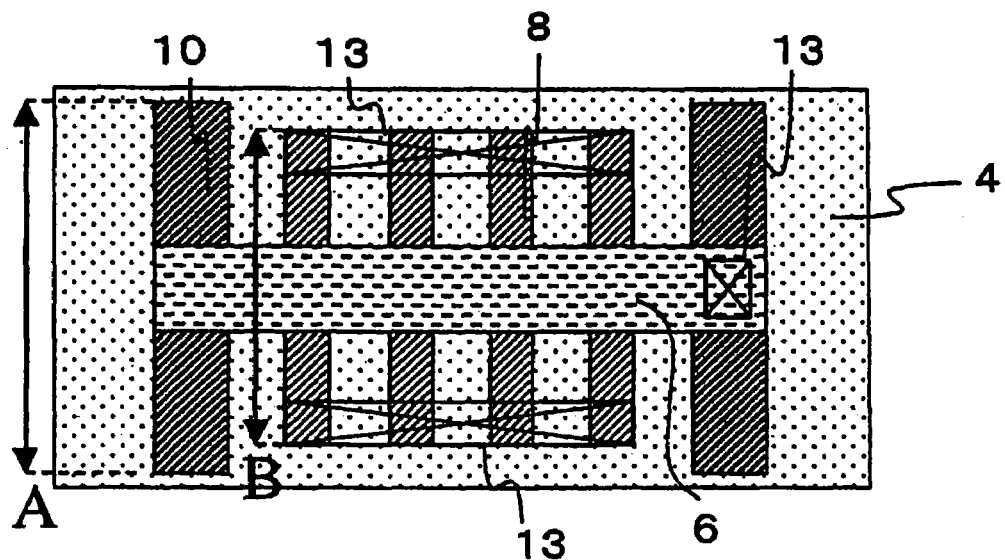
FIG. 20 shows an example of a semiconductor device according to the present invention.

FIG. 20 shows a variation of the semiconductor device in FIG. 19. FIG. 20 is a plan view of this semiconductor device. The semiconductor device in FIG. 20 is characterized in that a length "A" of the semiconductor layer 10 in a channel current direction is equal to or more than a length "B" of the semiconductor layer 8. Thus, the length of the semiconductor layer 10 which is larger than the length of the semiconductor layer 8 allows the side surface of the semiconductor layer 8 to be uniformly processed into a desired shape when forming the semiconductor layer. Thus, there can be provided a semiconductor device exhibiting excellent operation stability and device properties.

Figure 21:
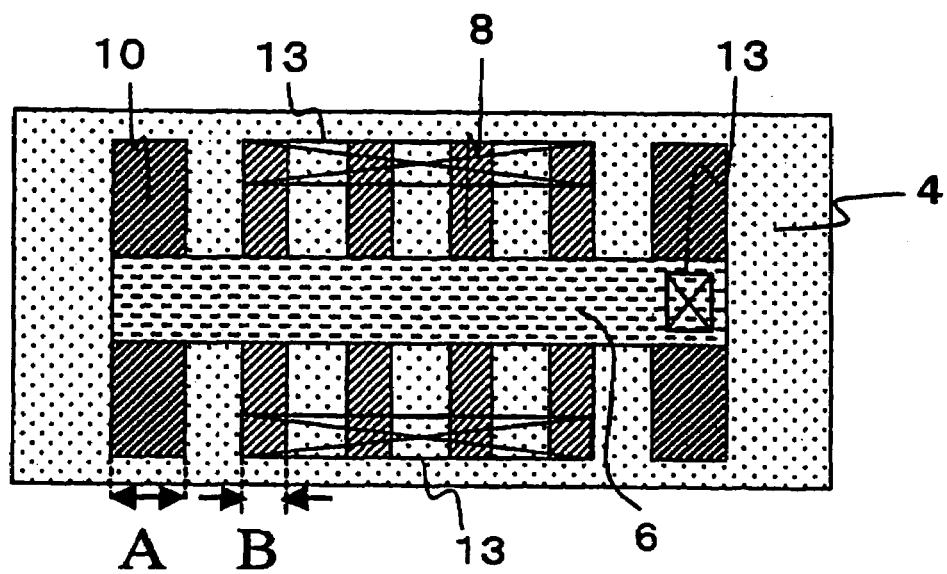
FIG. 21 shows an example of a semiconductor device according to the present invention.

FIG. 21 shows another example of a semiconductor device according to the present invention. FIG. 21 is a plan view of this semiconductor device. This semiconductor device is characterized in that a width "A" of the semiconductor layer 10 in a direction perpendicular to a channel current direction is larger than a width "B" of the semiconductor layer 8. Thus, the width "A" of the semiconductor layer 10 which is larger than the width "B" of the semiconductor layer 8 allows a contact to be more readily aligned above the semiconductor layer 10, resulting in reduction in a parasitic resistance. Furthermore, since mechanical strength of the semiconductor layer 10 is improved, when using a resist mask during forming the semiconductor layer, resist tilting can be more effectively prevented. In addition, in the light of processing the semiconductor layer 8 into a desired shape and higher integration, the semiconductor device can be optimized.

Figure 31:
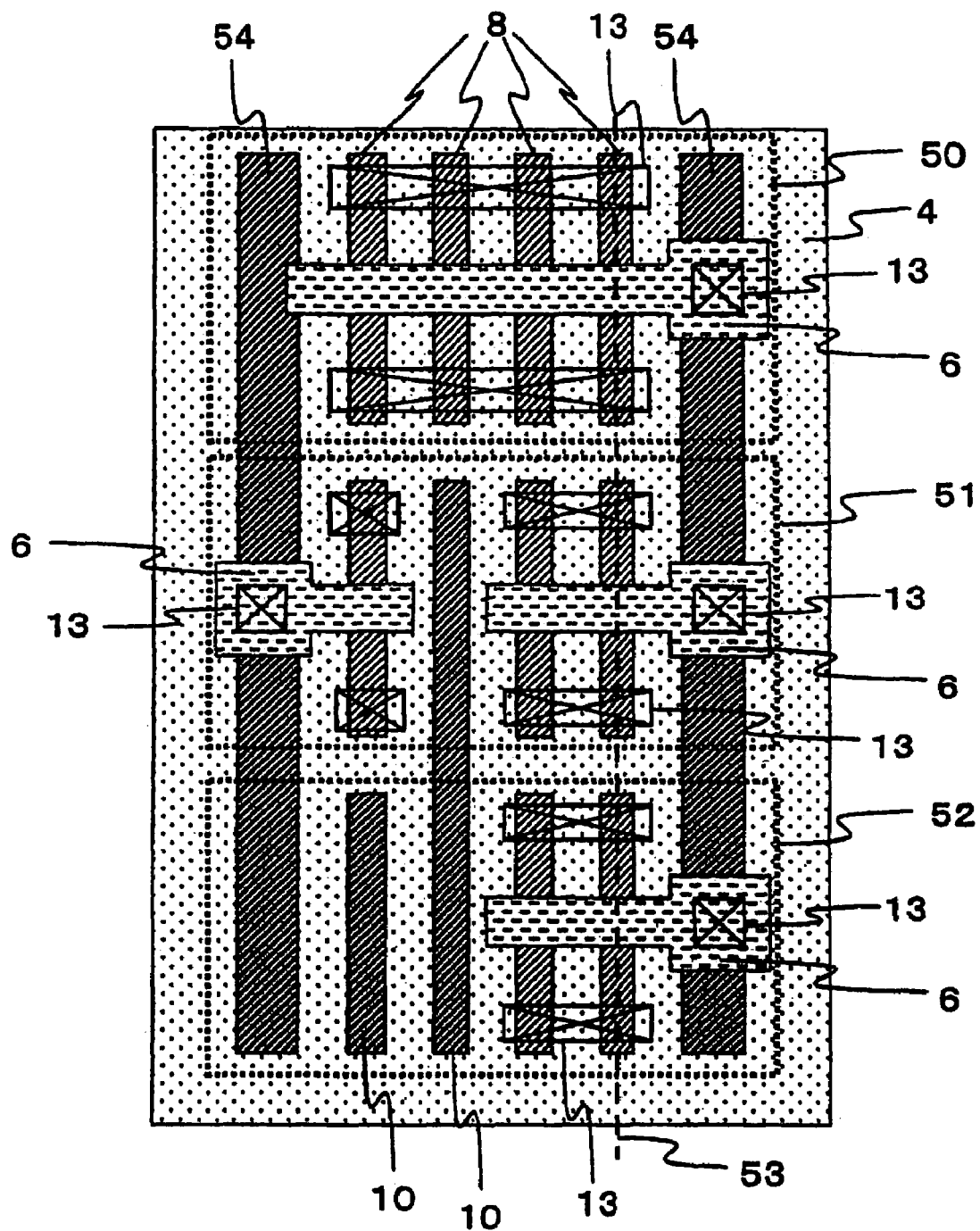
FIG. 31 shows an example of a semiconductor device according to the present invention.

FIG. 31 shows an example where a plurality of semiconductor devices according to the present invention are disposed on a substrate (plan view). In FIG. 31, there are three semiconductor devices 50 to 52 in a channel current direction. The semiconductor device 50 and the semiconductor device 51 correspond to the semiconductor devices in FIGS. 11 and 14, respectively. These semiconductor devices may be n-type or p-type MISFETs. Alternatively, they are a combination of these MISFETs.

The semiconductor layers 8 in the first semiconductor region in each semiconductor device are aligned mutually at even intervals such that their centers 53 are identical in a direction perpendicular to a channel current direction. Thus by aligning the semiconductor layers 8 such that their centers 53 are identical, there can be provided a semiconductor device exhibiting excellent device properties and having a higher integration density. The semiconductor layers 54 in the second semiconductor region are common to three semiconductor devices such that they sandwich all the semiconductor layers 8 from both sides. Thus, by forming the semiconductor layers 54 in both sides as a common part, the step of forming of the semiconductor layer can be facilitated, to provide a semiconductor device having a higher device density and exhibiting excellent designing accuracy. Here, between the semiconductor devices, the semiconductor layers 8 may be aligned without their centers 53 being identical, but the semiconductor layers 8 may be aligned in different intervals. The semiconductor layers 54 may be separately formed in each semiconductor device, but preferably aligned such that their centers in a direction perpendicular to a channel current direction are mutually identical.

Furthermore, in the semiconductor devices 51 and 52, there are the semiconductor layers 10 in the second semiconductor region between the semiconductor layers 54 (in the semiconductor device 51, there is one semiconductor layer 10 between the semiconductor layers 8 while in the semiconductor device 52, there are two semiconductor layers 10 between the semiconductor layer 54 and the semiconductor layer 8). Thus, by forming the semiconductor layer 10 in an area without the semiconductor layer 8, each semiconductor layer 8 can be uniformly formed during forming a semiconductor layer. Here, the semiconductor layers 10 between the semiconductor layers 54 are preferably formed such that they have an identical center 53 with the semiconductor layers 8 or 10 in another semiconductor device.

Figure 22:
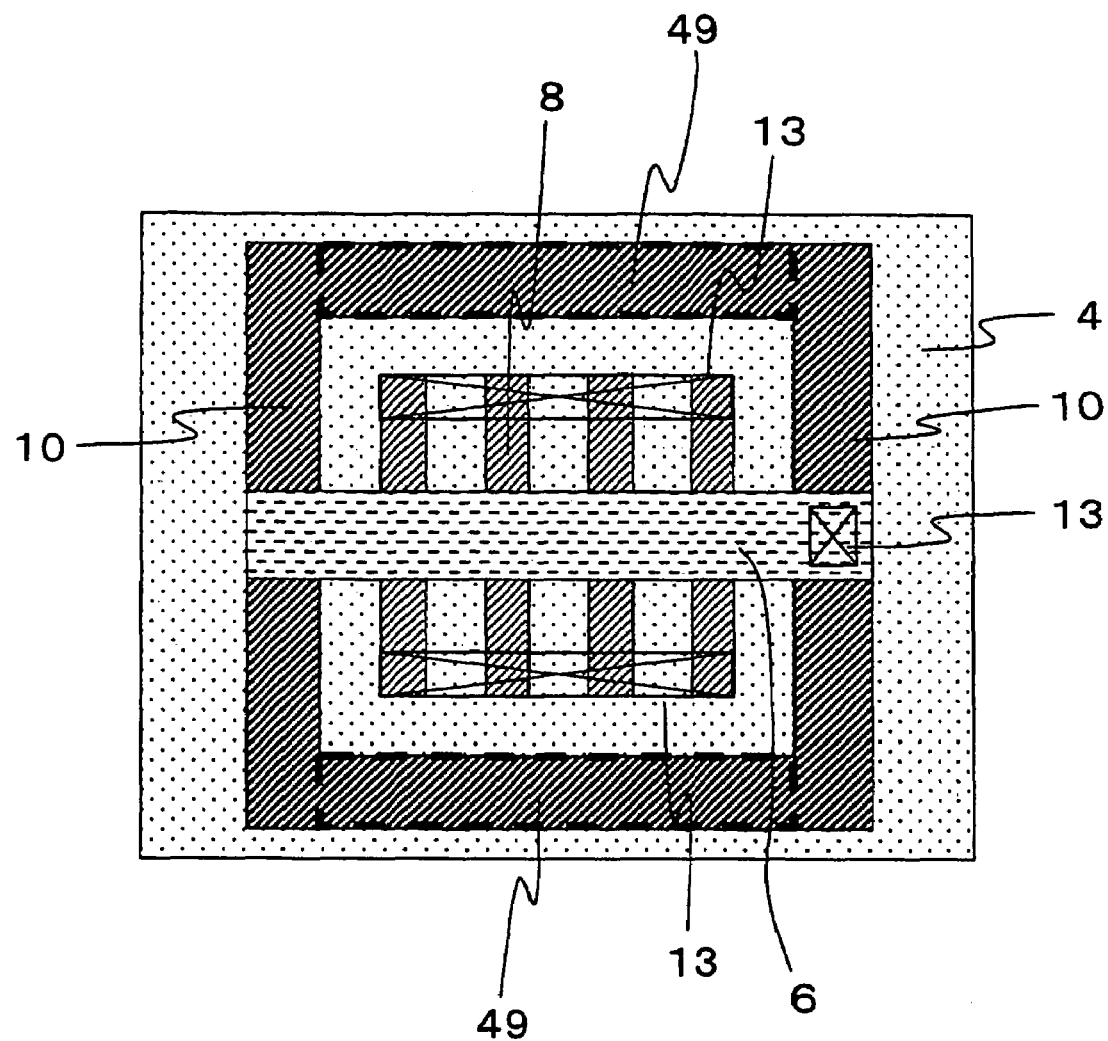
FIG. 22 shows an example of a semiconductor device according to the present invention.

FIG. 22 shows another example of a semiconductor device according to the present invention. In the semiconductor device in FIG. 22, there are further formed a pair of semiconductor layers 49 (the area enclosed by a dotted line) such that the semiconductor layers 10 surround the semiconductor layers 8 from one semiconductor layer 10 to the other semiconductor layer 10 in both sides in the first semiconductor region. In this semiconductor device, the semiconductor layers 10 and 49 constitute the second semiconductor region. Furthermore, since in this semiconductor device, the semiconductor layers 8 are surrounded by the semiconductor layers 10 and 49, process symmetry can be maintained in all part in the semiconductor layer 8 during forming semiconductor layers. Thus, there can be provided a semiconductor device exhibiting device stability and improved driving properties. Furthermore, the gate electrode 6 extends from one semiconductor layer 10 to the other semiconductor layer 10 in a direction perpendicular to a channel current direction. A contact with the gate electrode 6 is formed above a part of the semiconductor layer 10.

Manufacturing Process for a Semiconductor Device

There will be described a manufacturing process in accordance with the present invention.

Figure 23:
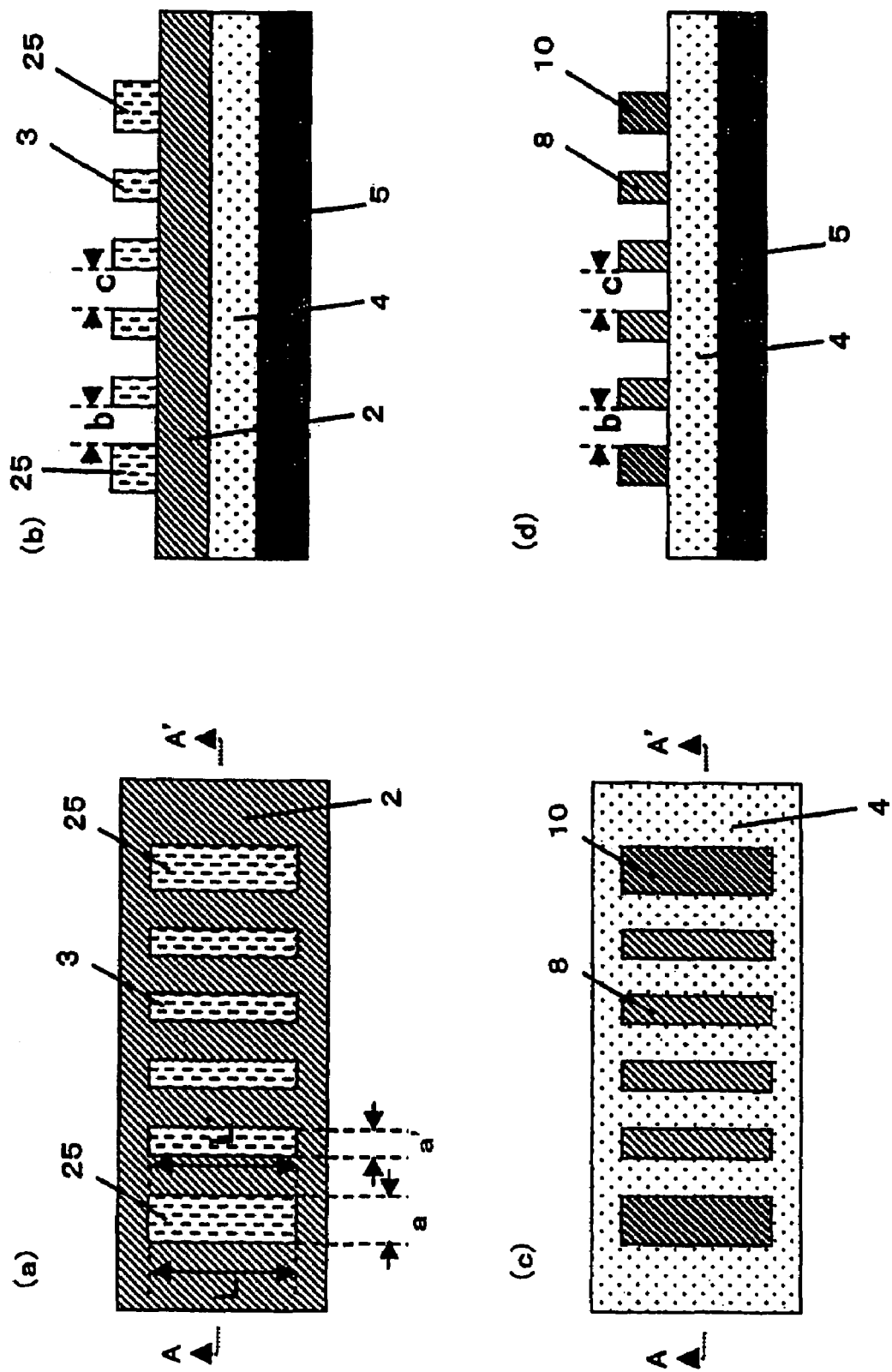
FIG. 23 shows an example of a manufacturing process for a semiconductor device according to the present invention.

FIG. 23 illustrates, as an example of a manufacturing process according to the present invention, a process for manufacturing a semiconductor device where individual source/drain regions in a plurality of semiconductor layers 8 in the first semiconductor region are connected to an interconnection 14 via a common contact.

First, on a substrate are formed an upward protruding first semiconductor region from the substrate and an upward protruding second semiconductor region from the substrate in both sides of the first semiconductor region. The first and the second semiconductor region can be formed by processing the semiconductor substrate on the substrate into a predetermined shape. By way of example, there will be described a process where an SOI substrate is etched using a mask having a given shape, to form a semiconductor layer. The mask may be a resist mask, a $SiO_2$ film or the like.

First, an SOI substrate is prepared, and a plurality of masks 3 are aligned in a given direction and masks 25 are formed in both sides of the masks 3. The mask may be, for example, a resist mask. FIG. 23(a) illustrates this state. FIG. 23(b) is a cross-sectional view taken on line A-A' of FIG. 23(a). FIG. 23 shows, by way of example, a mask pattern consisting of six masks.

The mask can have a desired shape, depending on the shape of a semiconductor layer which is formed later. Preferably, it is a substantially cuboid as shown in FIG. 23. Thus, the masks corresponding to the semiconductor layers in the second semiconductor region can be formed in both sides sandwiching the masks corresponding to the semiconductor layers in the first semiconductor region, to prevent tilting of the masks corresponding to the semiconductor layers in the first semiconductor region and thus to uniformly perform etching in a post-process.

As shown in FIG. 23, when the semiconductor layers 10 in the second semiconductor region are formed in both sides of the first semiconductor region, a width of the mask 25 corresponding to the semiconductor layer 10 (a length of the mask in an alignment direction: "a" in this figure) is preferably larger than a width of the mask 3 (a') in the light of preventing distortion of the mask. Furthermore, when the semiconductor layers 10 are also formed between the semiconductor layers 8 in the first semiconductor region, a width of the mask corresponding to this semiconductor layer 10 is preferably equal to the width (a') of the mask 3 in the light of process symmetry, but may be larger if it is required by circuit layout.

A length of the mask 25 in a longitudinal direction (a length in a direction perpendicular to the alignment of the masks: "L" in this figure) is preferably equal to or more than a gate length of a gate electrode 6 formed later ("d" in FIG. 24(c)). More preferably, the length "L" of the mask 25 is equal to or more than the length of the mask 3 (L'). With the mask 25 having such width and length, mechanical strength of the mask 25 can be improved and damage in the mask 3 can be more effectively prevented during forming the masks. For example, when using a resist mask as the mask, mask tilting due to a rinse agent during cleaning after the step of photolithography can be prevented and the later etching step can be more uniformly performed. FIG. 23 shows a case where the mask 25 has a width larger than the width of the mask 3 and the length (L) of the mask 25 is equal to the length (L') of the mask 3.

The length of the mask 25 is preferably equal to or larger than the length of the mask 3. The length of the mask 25 within these limits can more effectively prevent the mask 3 from being damaged during forming the masks. For example, when the mask is a resist mask, resist tilting can be effectively prevented. Furthermore, symmetry in microloading effect in the semiconductor layer 8 during etching can be maintained, to provide a semiconductor layer 8 with a desired shape.

It is preferable that a distance "c" between the masks 3 is constant. A distance "b" between one end mask 25 and its adjacent mask 3 is preferably equal to a distance between the other end mask 25 and its adjacent mask 3. Furthermore, all inter-mask (masks 3 and 25) distances are preferably constant (b=c). When b and c are constant or b=c as described above, a semiconductor layer can be easily formed, to provide a semiconductor device exhibiting excellent device properties and operation stability.

FIG. 23(c) shows the state where the first and the second semiconductor region are formed using the masks. FIG. 23(d) is a cross-sectional view taken on line A-A' of FIG. 23(c). In this manufacturing process, the semiconductor layer 8 corresponds to the mask 3, and four semiconductor layers 8 are aligned in a given direction. These semiconductor layers 8 constitute the first semiconductor region. There are no particular restrictions to the number of the semiconductor layers 8 as long as it is one or more.

In both sides of the semiconductor layers 8, there are formed the semiconductor layers 10 which correspond to the mask 25. These semiconductor layers 10 constitute the second semiconductor region. The number of the semiconductor layers 10 is at least one in each side of the semiconductor layers 8. For forming the semiconductor layers 8 and 10 with desired shapes, the masks 3 and 25 can be formed such that the masks 3 and 25 correspond to these semiconductor layers, respectively. For example, a width of the source/drain regions in the semiconductor layer 8 can be larger than a width of the part in the semiconductor layer 8 covered by the gate electrode. At least the side surface facing the semiconductor layer 8 of the side surfaces of the semiconductor layer 10 must be formed in parallel with a direction of channel current flow in the semiconductor layer 8. Alternatively, as the second semiconductor region, there may be further formed a pair of semiconductor layers which surround the semiconductor layers 8 from one semiconductor layer 10 to the other semiconductor layer 10 in both sides in the first semiconductor region.

The semiconductor layer 8 is, for example, a substantially cuboid and has a width of 10 nm, a length of 100 nm and a height of 100 nm, preferably a width of 5 to 100 nm and a height of 20 to 200 nm.

Next, the gate electrode 6 is formed, striding over at least one semiconductor layer 8. The gate electrode 6 can be formed by depositing a gate insulating film 7 and a polysilicon film 19 on a semiconductor layer and then processing it into a given shape. For example, it can be formed by forming a resist mask with a given shape on the gate insulating film 7 and the polysilicon film 19 and then performing etching.

Figure 24:
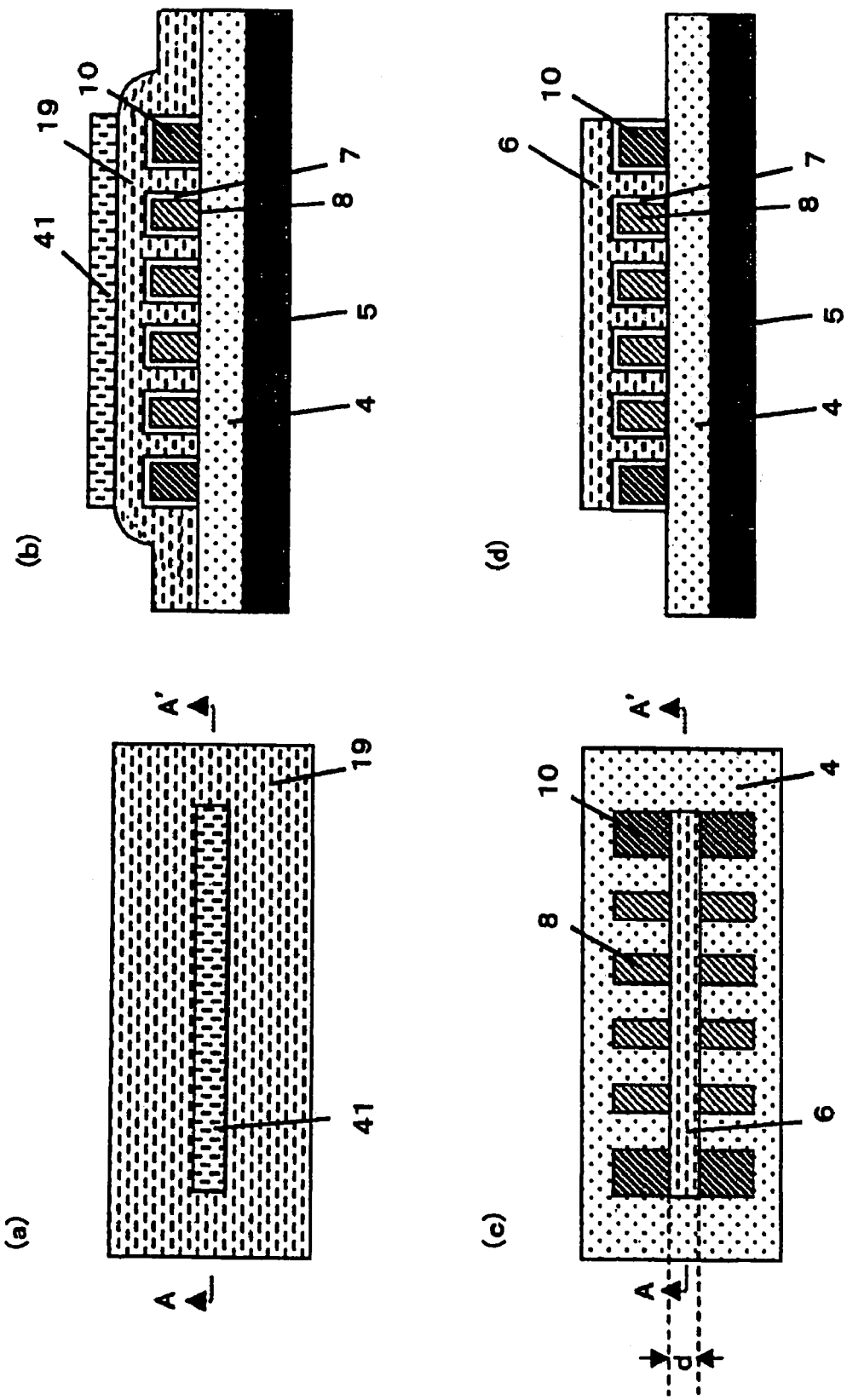
FIG. 24 shows an example of a manufacturing process for a semiconductor device according to the present invention.

For forming a gate electrode, a gate insulating film 7 is first formed on a semiconductor layer. Here, for forming a triple-gate type MISFET, a thin $SiO_2$ film as a gate insulating film 7 is formed on the surface (the upper and the side surfaces) in the semiconductor region by a thermal oxidation method. For forming a double-gate type MISFET, while leaving the $SiO_2$ used as a mask during forming the semiconductor layer on the semiconductor layer 8, an additional $SiO_2$ film is formed over the layer. A SiO2 film 7 may be or may not be formed on the semiconductor layer 10 in the second semiconductor region (FIG. 24 shows an example where a SiO2 film 7 is formed on the semiconductor layer 10). Examples of a gate insulating film may include, in addition to $SiO_2$ film and SiON film, $Ta_2O_5$ film, $Al_2O_3$ film, $La_2O_3$ film, $HfO_2$ film, $ZrO_2$ film, HfSiO film and HfSiON film and so on.

Next, on this $SiO_2$ film 7 is formed by CVD a polysilicon film 19, which is then made conductive by impurity diffusion. Then, a mask 41 for forming a gate electrode is deposited on the polysilicon film 19. FIG. 24(*a*) is a plan view showing the state. FIG. 24(*b*) is a cross-sectional view taken on line A-A' of FIG. 24(*a*).

Then, after processing the film into the shape of the gate electrode using the mask 41, the mask 41 is removed. FIG. 24(*c*) is a plan view showing the state, and FIG. 24(*d*) is a cross-sectional view taken on line A-A' of FIG. 24(*c*). The gate electrode may be formed such that it strides over a plurality of semiconductor layers. Furthermore, the gate electrode may be formed such that the gate electrode extends from the semiconductor layer 8 to the semiconductor layer 10. Here, the gate electrode 6 may be acceptable as long as it extends to at least a part of the upper surface of the semiconductor layer 10, but preferably it extends to the upper surface of the semiconductor layer 10. Thus, for obtaining a gate electrode with a desired shape, a mask pattern corresponding to the gate electrode can be formed and processing can be performed using the mask.

As shown in FIG. 24, a gate electrode is preferably formed such that it covers the whole upper surface of the semiconductor layer 10. In a gate electrode having such a structure, processability during forming a gate electrode can be improved, to provide a semiconductor device exhibiting excellent operation properties. For example, when using a resist mask as a mask, size irregularity of the mask due to focus offset occurs in a bump in the polysilicon film during exposure. When conducting etching in such a state, size irregularity occurs corresponding size irregularity of the mask in a bump in the gate electrode. However, in the manufacturing process of the present invention, the gate electrode over the semiconductor layer 8 is flat (because of no bumps), and thus focus offset does not occur in the gate electrode over the semiconductor layer 8.

Furthermore, in a process for manufacturing a semiconductor device according to the related art, gate length irregularity occurs due to asymmetry in microloading effect in the polysilicon film deposited on a bump during etching. In other words, an etching rate of the polysilicon film between the semiconductor layers 8 is lower than an etching rate of the polysilicon film outside of the bump due to microloading effect. Therefore, a gate length in the polysilicon film outside of the bump is smaller than the gate length in the polysilicon film between the semiconductor layers 8. However, in the manufacturing process of the present invention, since symmetry in microloading effect is maintained in the polysilicon film over the semiconductor layer 8, the gate length of the gate electrode over the semiconductor layer 8 can be kept constant. The gate length is preferably 5 to 100 nm.

In the semiconductor device of FIG. 24, the gate electrode is formed, extending from one semiconductor layer 10 to the other semiconductor layer 10. Thus, the gate electrode 6 formed on the semiconductor layers 8 has the same height, to improve flatness of the gate electrode. Although a material for the gate electrode is suitably polysilicon, equivalent effects can be obtained in this invention when using, for example, another semiconductor such as silicon-germanium or a metal material such as tungsten, titanium nitride and nickel silicide as a gate electrode material.

Then, extension ion implantation is conducted from an oblique direction. Here, since a semiconductor layer 8 is absent in the opposite site to one side surface in the semiconductor layer 10, the amount of reflected ions from other semiconductor regions is reduced during the ion implantation. On the other hand, since there are the semiconductor layers 8 or 10 in both sides of all the semiconductor layers 8, the amount of reflected ions during ion implantation is equal for all the semiconductor layers 8 and thus when forming a plurality of semiconductor layers 8, a impurity concentration can be kept constant in these semiconductor layers 8. Equivalent effects can be obtained in a case where halo implantation is conducted by oblique ion implantation.

Figure 25:
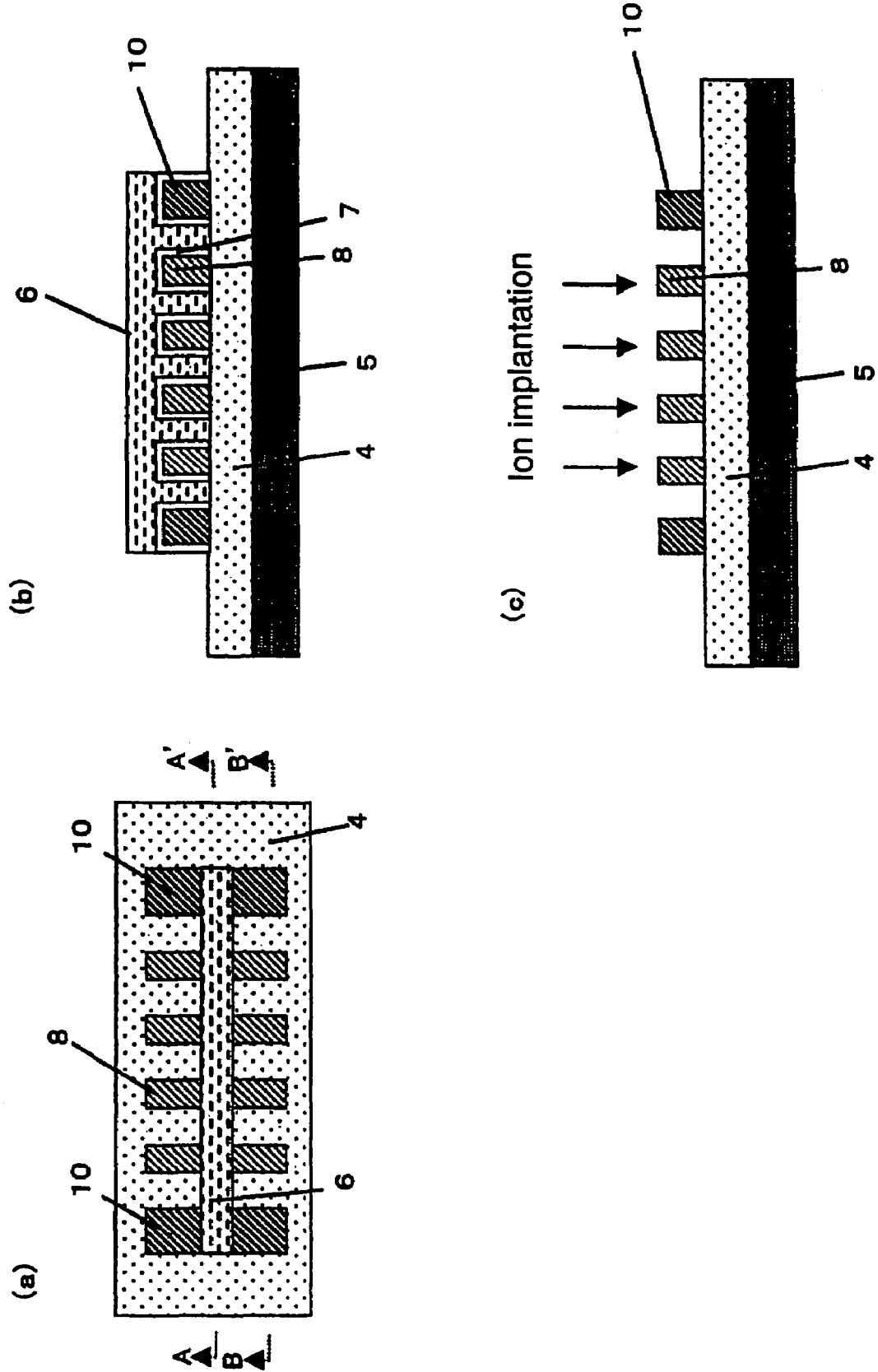
FIG. 25 shows an example of a manufacturing process for a semiconductor device according to the present invention.

Then, for example, a silicon oxide film is deposited by CVD method, and then RIE is conducted to form a gate sidewall (not shown). Using the gate electrode 6 and the gate sidewall as a mask, ion implantation is conducted to dope the semiconductor region with impurity and to form a source/drain regions. FIG. 25(*a*) is a plan view showing this state. FIG. 25(*b*) is a cross-sectional view taken on line A-A' of FIG. 25(*a*) and FIG. 25(*c*) is a cross-sectional view taken on line B-B' of FIG. 25(*a*). Here, the semiconductor layer 10 may be or may not be ion-implanted. It is because source/drain regions does not have to be formed since a channel current is not applied to the semiconductor layer 10.

When ion implantation into the semiconductor layer 10 is not conducted, a mask can be formed on the semiconductor layer 10 before doping of the semiconductor layer and the mask can be removed after doping of the semiconductor layer 8. Then, if necessary, a silicide film (not shown) such as $TiSi_2$, $CoSi_2$, PtSi, $Pd_2Si$, $IrSi_3$, RhSi and NiSi can be formed on the surface of the source/drain regions.

Then, on the above structure is formed by CVD method an interlayer insulating film 16 such as $SiO_2$, which is then planarized by CMP method. Then, by photolithography or RIE, a contact hole 13 is formed on the source/drain regions and the gate electrode. Here, the contact hole 13 formed on the source/drain regions may be common for the semiconductor layers 8 in a plurality of first semiconductor regions, or may be separately formed for the source and drain regions in the individual semiconductor layers 8.

There are no particular restrictions to the position of the contact hole 13 on the gate electrode as long as it is on the gate electrode, and it is preferably formed over the semiconductor layer 10. Here, since the contact hole 13 on the gate electrode has the same depth as the contact hole 13 formed on the source/drain regions, forming a contact hole can be facilitated. The contact hole is formed by conducting patterning such that a photoresist remains except in the area to be opened and then conducting etching.

Subsequently, the contact hole 13 is filled with, for example, a tungsten film, an aluminum film, a titanium nitride/titanium film or a laminated film of these by CVD method, and then excessive tungsten deposited in the area other than the contact hole 13 is removed by plasma etching or polishing, to form a contact plug. Thus, the contact plug is formed within the contact hole 13.

Then, on the interlayer insulating film 16 is formed an interconnection 14 electrically contacting with the contact plug. This interconnection layer is formed by depositing a layer containing aluminum as a main component by, for example, sputtering method, forming a mask with a desired pattern and doing etching.

Figure 26:
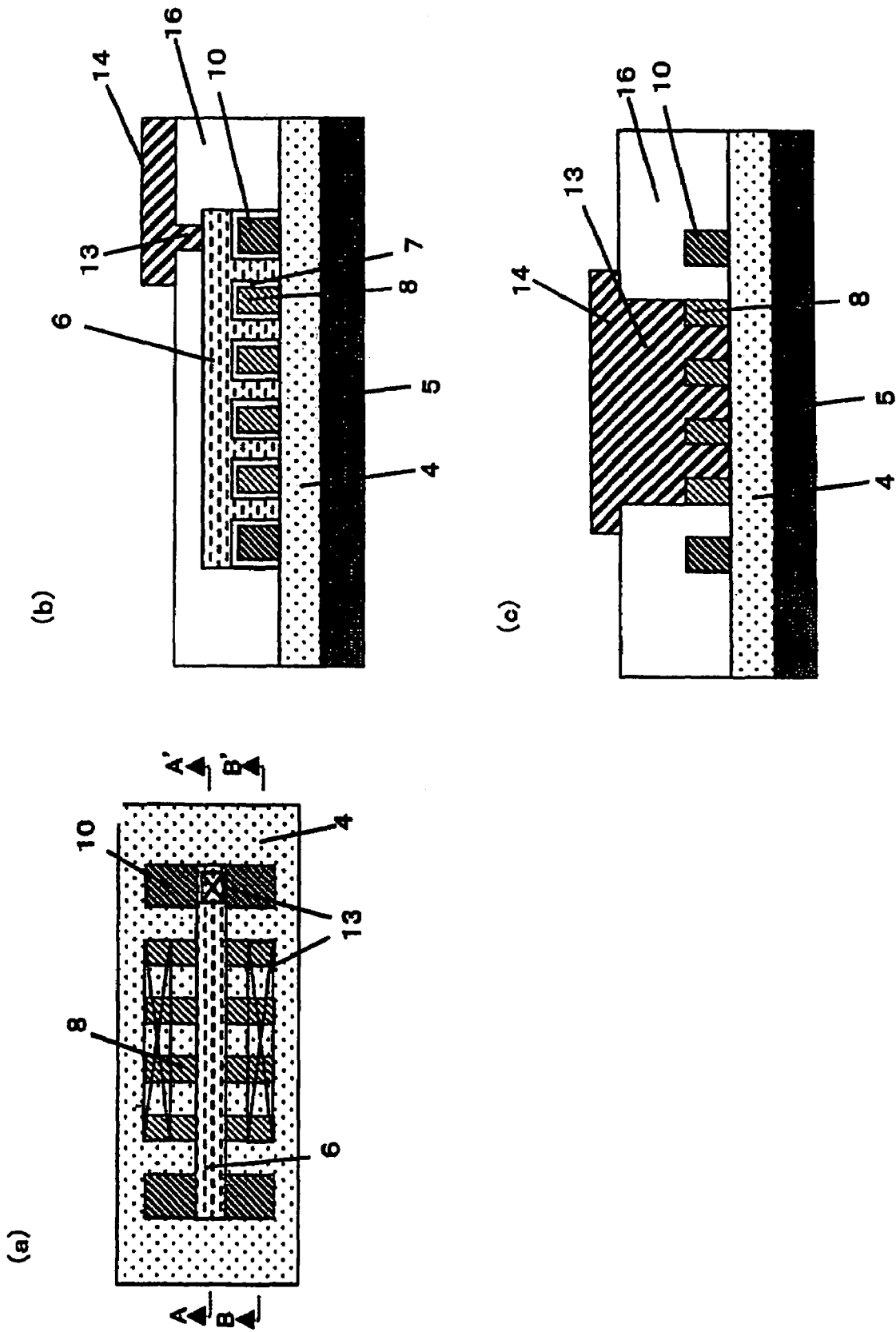
FIG. 26 shows an example of a manufacturing process for a semiconductor device according to the present invention.

The interconnection 14 is made of, for example, a conductive material containing aluminum as a main component. Furthermore, a passivation film (not shown) is deposited on the interlayer insulating film 16 and the interconnection 14, to provide a semiconductor device. FIG. 26(a) is a plan view showing the state. FIG. 26(b) is a cross-sectional view taken on line A-A' of FIG. 26(a) and FIG. 26(c) is a cross-sectional view taken on B-B' of FIG. 26(a). FIG. 26 shows a semiconductor device where a common contact is formed for the source/drain regions in the individual semiconductor layers 8.

Although the second semiconductor region are formed in both sides of the first semiconductor region in the above manufacturing process for a semiconductor device, the second semiconductor region may be formed additionally between the semiconductor layers 8 in the first semiconductor region. Here, after forming a plurality of semiconductor layers on the substrate, source/drain regions may not be formed by ion implantation in a semiconductor layer which is to be formed as the second semiconductor region between the semiconductor layers 8, or alternatively, when forming source/drain regions in the semiconductor layer 10, a contact with the source/drain regions may not be formed. There are no particular restrictions to the number of the semiconductor layers 10 formed between the semiconductor layers 8, and two or more semiconductor layers 10 may be formed. There are no particular restrictions to a site where the semiconductor layer 10 is to be formed, and they can be formed in different sites (between the semiconductor layers 8). The gate electrode 6 may or may not extend to the middle semiconductor layer 10.

Figure 27:
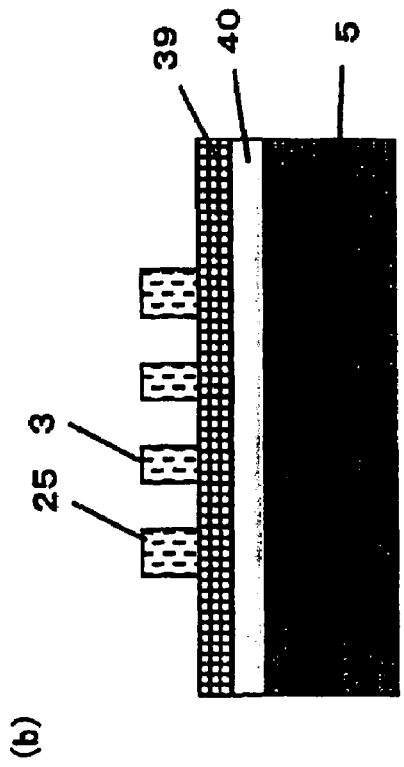
FIG. 27 shows an example of a manufacturing process for a semiconductor device according to the present invention.
Figure 27:
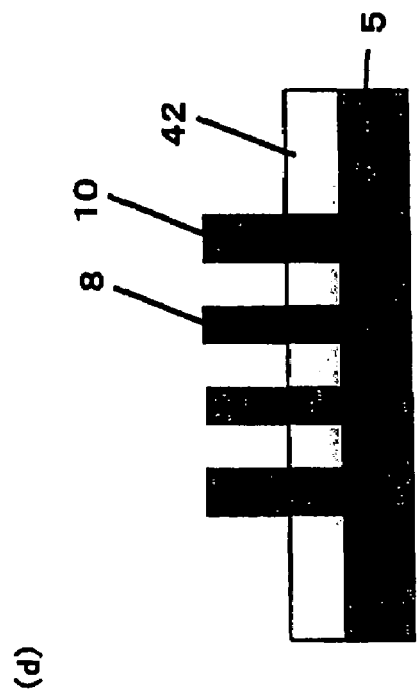
Figure 27:
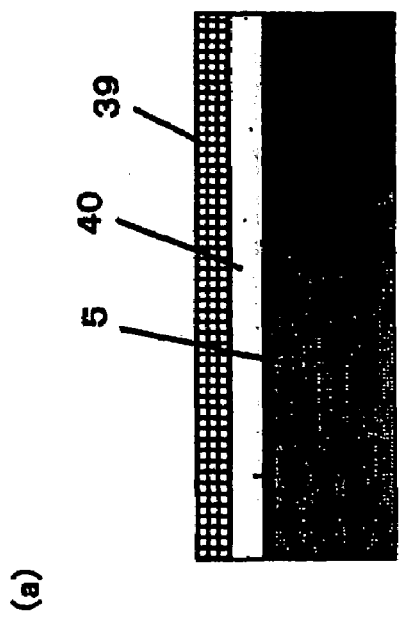
Figure 27:
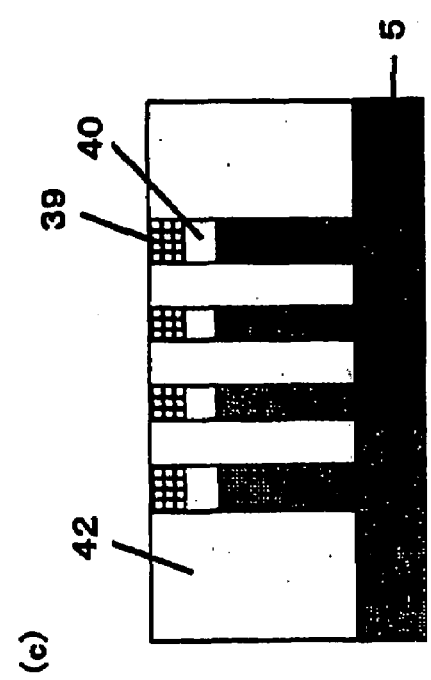

FIG. 27 shows an exemplary process for manufacturing a semiconductor device where the first semiconductor region and the second semiconductor region protrude directly from the silicon wafer substrate 5 (corresponding to the semiconductor device in FIG. 10). First, on the silicon wafer substrate 5 is formed a $SiO_2$ film 40 and then a doped layer is made in the silicon wafer substrate 5 by ion implantation. Then, after depositing an SiN film 39 by, for example, CVD method (FIG. 27(a)), masks 3 and 25 are formed on the SiN film 39 (FIG. 27(b)). Subsequently, after forming a protrusion with a given shape using the masks, for example, CVD method is used to deposit a separating insulating film 42, which is then planarized by, for example, CMP (FIG. 27(c)). Then, further etching is conducted to remove the separating insulating film 42 to a predetermined thickness and then to form the protruding semiconductor layers 8 and 10. Then, the $SiO_2$ film 40 and the SiN film 39 are removed to form the semiconductor layers 8 and 10. Subsequent steps are conducted as described above, to form a semiconductor device.

Figure 28:
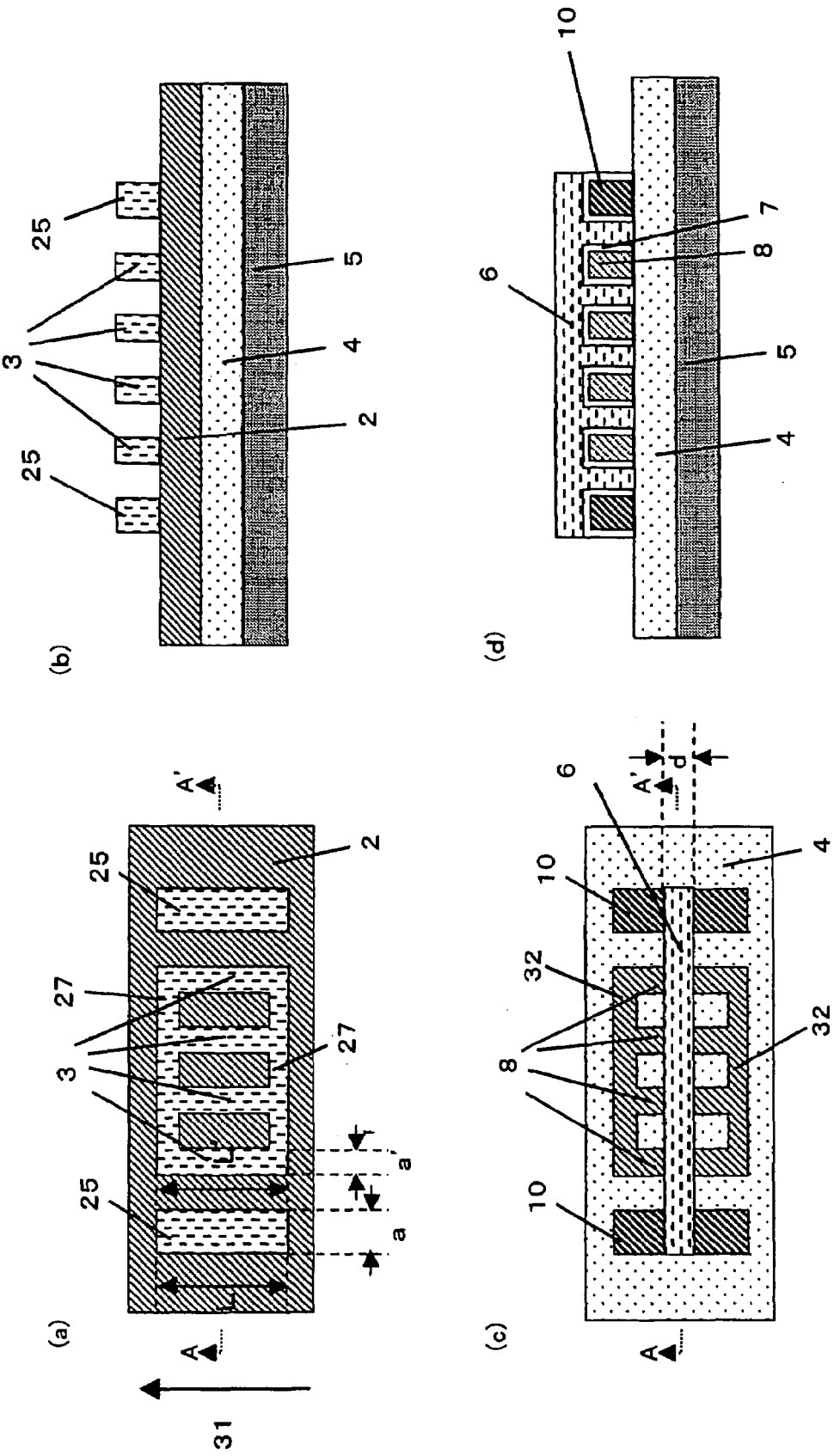
FIG. 28 shows an example of a manufacturing process for a semiconductor device according to the present invention.

FIG. 28 shows another exemplary process for manufacturing a semiconductor device according to the present invention. In this semiconductor device, source/drain regions are electrically connected via the semiconductor layers and become common. FIG. 28(a) is a plan view showing the state where a mask is formed for forming semiconductor layers in this semiconductor device, and FIG. 28(b) is a cross-sectional view taken on line A-A' of FIG. 28(a). First, a mask pattern is formed, which consists of masks 3 aligned in a given direction at even intervals, masks 25 disposed in both sides of the masks 3 and mask 27 which extends in the alignment direction of the masks 3 and sandwiching and connecting four masks 3.

Then, using the masks, the first and the second semiconductor region are formed. The first semiconductor region corresponds to the semiconductor layers 8 and 32 formed using the masks 3 and 27 and the second semiconductor region corresponds to the semiconductor layers 10 formed using the masks 25. Next, on this semiconductor layer are formed an oxide film 7 and a polysilicon film 19, and then a mask having a given shape for forming a gate electrode is formed. Then, using the mask, the oxide film 7 and the polysilicon film 19 are removed to form a gate electrode 6 with a given shape. FIG. 28(c) is a plan view showing the state and FIG. 28(d) is a cross-sectional view taken on line A-A' of FIG. 28(c). In FIG. 28(c), the gate electrode 6 is formed such that it extends from one semiconductor layer 10 to the other semiconductor layer 10, striding over all the semiconductor layers 8 and 10.

Next, a gate sidewall is formed, and using the gate electrode and the gate sidewall as a mask, source/drain regions are formed in an area which is not covered by the gate electrode in the semiconductor layer 8, and then an interlayer insulating film 16 is formed on this semiconductor device. Then, over either one of the semiconductor layers 10 is formed a contact with the gate electrode 6, and then on the source/drain regions of the semiconductor layer 8 is formed a contact. There are no particular restrictions to the position of the contact with the source/drain regions as long as it is on the semiconductor layer 8. Thus, alignment of the contact can be facilitated. Furthermore, the step of forming the contact can be simplified.

Figure 29:
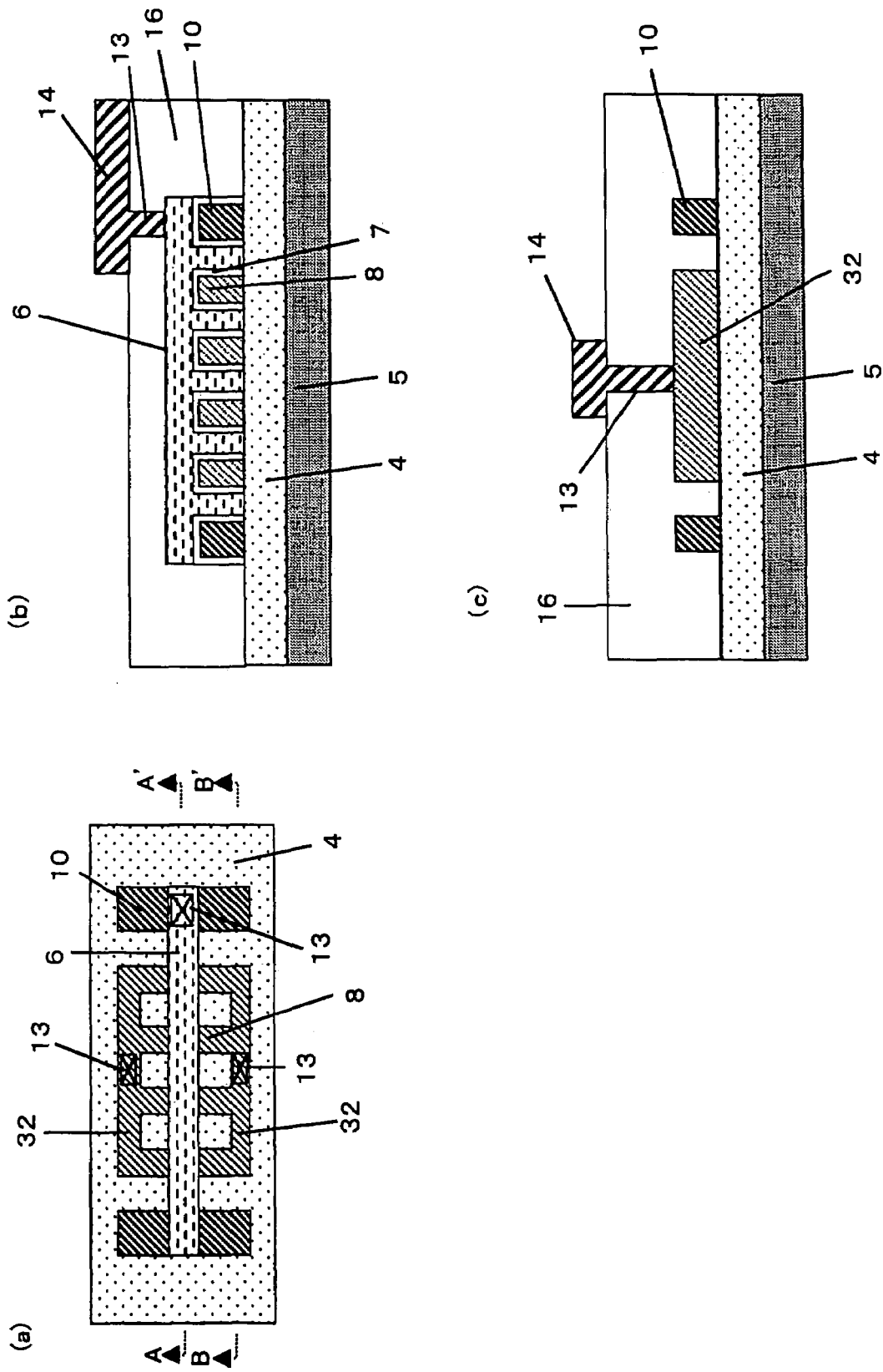
FIG. 29 shows an example of a manufacturing process for a semiconductor device according to the present invention.
Figure 30:
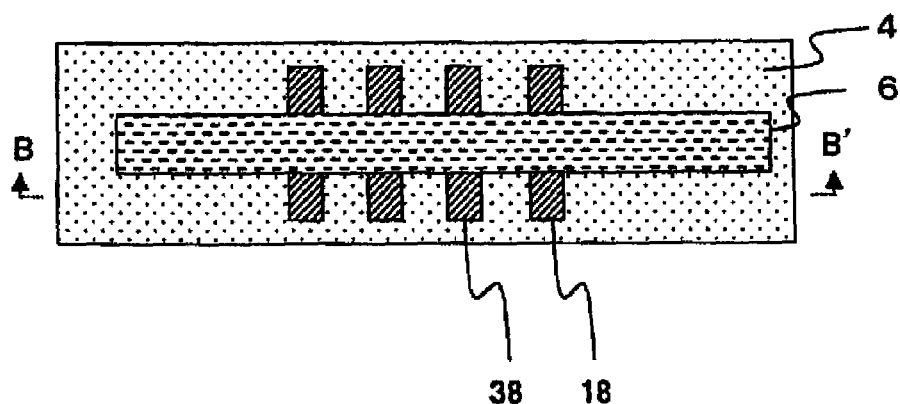
FIG. 30 shows an example of a manufacturing process for a semiconductor device according to the related art.
Figure 30:
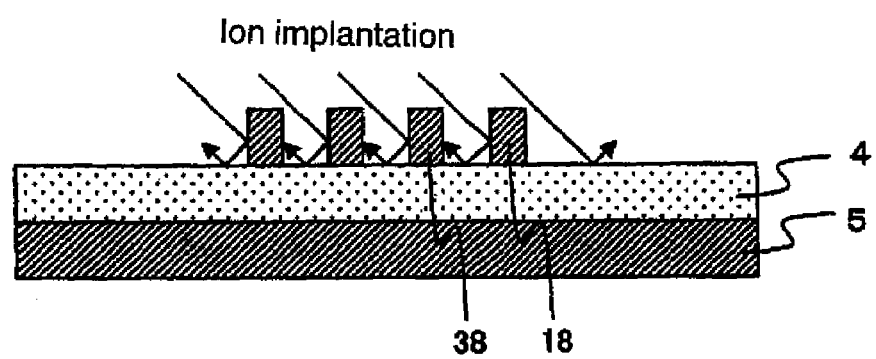

FIG. 29(a) is a plan view showing the state. FIG. 29(b) is a cross-sectional view taken on line A-A' of FIG. 29(a) and FIG. 29(c) is a cross-sectional view taken on line B-B' of FIG. 29(a). As a variation of the above manufacturing process, there can be formed a semiconductor device where the number of the semiconductor layers 8 contained in common source and drain regions are different (for example, corresponding to FIG. 17). Here, etching can be conducted using a mask having a shape corresponding to the shape of the semiconductor layer.

There have been herein described the effects when a gate electrode material is etched to form a gate electrode, but equivalent effects can be obtained in forming a gate electrode by a damascene gate method. In the damascene gate method, a dummy gate is formed as used in forming a usual gate electrode, the dummy gate is transferred to an insulating film to form a trench to be a mold for a gate, and then the trench is filled with a gate electrode material to form a transistor. Since the dummy gate is formed by etching as used in forming a gate electrode described herein, the present invention can have similarly effective in a damascene gate method.

The invention claimed is:

1. A semiconductor device comprising a first semiconductor region and a second semiconductor region,
    (a) wherein a plurality of field effect transistors are comprised of the first semiconductor region comprising a plurality of semiconductor layers protruding upward from a substrate and aligned such that the channel current direction is mutually parallel, a gate electrode(s) formed via insulating films such that the gate electrode(s) strides over the semiconductor layers and source/drain regions provided in the semiconductor layers on both sides of the gate electrode(s), whereby a channel region is formed in at least both side surfaces of the semiconductor layers, (b) wherein the second semiconductor region comprises semiconductor layers protruding upward from the substrate and placed, opposing the first semiconductor region at both ends in the direction perpendicular to a channel current direction and between the semiconductor layers in the first semiconductor region, and the side surfaces of the semiconductor layers facing the first semiconductor region are parallel to the channel current direction.

2. The semiconductor device as claimed in claim 1, wherein separate source/drain regions and separate gate electrodes are formed to each of the plurality of the semiconductor layers in the first semiconductor region.

3. The semiconductor device as claimed in claim 1, wherein the gate electrode(s) is formed such that the gate electrode(s) strides over at least two of the plurality of the semiconductor layers.

4. The semiconductor device as claimed in claim 1, wherein individual source/drain regions in the plurality of the semiconductor layers are electrically commonly connected and the gate electrode(s) is formed such that the gate electrode(s) strides over the commonly connected semiconductor layers.

5. The semiconductor device as claimed in claim 1, wherein the first semiconductor region further comprises a connecting semiconductor layer which protrudes upward from the substrate and electrically commonly connects source/drain regions of at least two of the plurality of the semiconductor layers by extending in the direction perpendicular to the channel current direction; and the gate electrode(s) is formed such that the gate electrode(s) strides over the semiconductor layers connected by the connecting semiconductor layer.

6. The semiconductor device as claimed in claim 1, wherein the plurality of the semiconductor layers are aligned at even intervals in the direction perpendicular to the channel current direction.

7. The semiconductor device as claimed in claim 1, wherein the semiconductor layers in the second semiconductor region formed in both sides of the first semiconductor region are disposed at even intervals from the first semiconductor region.

8. The semiconductor device as claimed in claim 1, wherein the semiconductor layers in the first semiconductor region and the semiconductor layers in the second semiconductor region are aligned at even intervals in the direction perpendicular to the channel current direction.

9. The semiconductor device as claimed in claim 1, wherein the gate electrode(s) is formed, extending from over the semiconductor layers in the first semiconductor region to over the semiconductor layers in the second semiconductor region.

10. The semiconductor device as claimed in claim 9, wherein a contact with the gate electrode(s) is formed over the semiconductor layers in the second semiconductor region.

11. The semiconductor device as claimed in claim 1, wherein at least a part covered by the gate electrode(s) in the semiconductor layers in the first semiconductor region has a substantially cuboid shape.

12. The semiconductor device as claimed in claim 1, wherein the semiconductor layers in the first semiconductor region have a substantially cuboid shape.

13. The semiconductor device as claimed in claim 1, wherein in the channel current direction, a length of the semiconductor layers in the second semiconductor region in both sides of the first semiconductor region is longer than a length of the gate electrode(s).

14. The semiconductor device as claimed in claim 1, wherein in the channel current direction, a length of the semiconductor layers in the second semiconductor region in both sides of the first semiconductor region is equal to or larger than a length of the semiconductor layers in the first semiconductor region.

15. The semiconductor device as claimed in claim 1, wherein in the direction perpendicular to the channel current direction, a width of the semiconductor layers in the second semiconductor region in both sides of the first semiconductor region is equal to or larger than a width of the semiconductor layers in the first semiconductor region.

16. The semiconductor device as claimed in claim 1, wherein the second semiconductor region further comprises a pair of semiconductor layers which connects from one semiconductor layer to the other semiconductor layer of the semiconductor layers in both sides of the first semiconductor region such that the second semiconductor region surrounds the first semiconductor region.

17. A process for manufacturing a semiconductor device, comprising:

forming fin-type semiconductor layers for forming a first semiconductor region comprising a plurality of semiconductor layers protruding upward from a substrate such that direction of channel current flowing in the individual semiconductor layers is mutually parallel, and a second semiconductor region comprising semiconductor layers protruding upward from the substrate in both sides sandwiching the first semiconductor region and between the semiconductor layers in the first semiconductor region; and forming a transistor by forming a gate electrode(s) striding over the semiconductor layers in the first semiconductor region, insulating films between the gate electrode(s) and at least both side surfaces of the semiconductor layers and source/drain regions in both sides sandwiching the gate electrode(s) in the semiconductor layers.

18. The process for manufacturing a semiconductor device as claimed in claim 17, wherein in the step of forming the fin-type semiconductor layers, the first semiconductor region and the second semiconductor region are formed such that the side surface of the second semiconductor region in the side of the first semiconductor region is parallel to a channel current direction.

19. The process for manufacturing a semiconductor device as claimed in claim 17, wherein in the step of forming the fin-type semiconductor layers, the first semiconductor region and the second semiconductor region are simultaneously formed by processing a semiconductor substrate on the substrate into a predetermined shape.

20. The process for manufacturing a semiconductor device as claimed in claim 19, wherein in the step of forming the fin-type semiconductor layers, the processing into the predetermined shape is conducted by etching the semiconductor substrate using a mask having a shape corresponding to the first semiconductor region and the second semiconductor region.

21. The process for manufacturing a semiconductor device as claimed in claim 17, wherein in the step of forming the transistor, the gate electrode(s) is formed such that the gate electrode(s) extends from over the semiconductor layers in the first semiconductor region to over the semiconductor layers in the second semiconductor region.

22. The process for manufacturing a semiconductor device as claimed in claim 21, wherein in the step of forming the transistor, a contact with the gate electrode(s) is further formed over the semiconductor layers in the second semiconductor region to which the gate electrode(s) extends.

23. The process for manufacturing a semiconductor device as claimed in claim 17, wherein in the step of forming the transistor, a plurality of the gate electrodes are formed such that each gate electrode strides over one semiconductor layer in the first semiconductor region.

24. The process for manufacturing a semiconductor device as claimed in claim 17, wherein in the step of forming the transistor, the gate electrode(s) is formed such that the gate electrode(s) strides over at least two or more of the plurality of the semiconductor layers in the first semiconductor region.

25. The process for manufacturing a semiconductor device as claimed in claim 17, wherein in the step of forming the fin-type semiconductor layers, a connecting semiconductor layer is further formed as the first semiconductor region, which protrudes upward from the substrate, extends in a direction perpendicular to the channel current direction and electrically commonly connects at least two of the plurality of the semiconductor layers; and wherein in the step of forming the transistor, the gate electrode(s) is formed such that the gate electrode(s) strides over the semiconductor layers connected by the connecting semiconductor layer.

26. The process for manufacturing a semiconductor device as claimed in claim 17, wherein in the step of forming the fin-type semiconductor layers, the plurality of the semiconductor layers in the first semiconductor region are formed at even intervals in the direction perpendicular to the channel current direction.

27. The process for manufacturing a semiconductor device as claimed in claim 17, wherein in the step of forming the fin-type semiconductor layers, the semiconductor layers in the second semiconductor region are disposed in both sides of the first semiconductor region at even intervals from the first semiconductor region.

28. The process for manufacturing a semiconductor device as claimed in claim 17, wherein in the step of forming the fin-type semiconductor layers, the plurality of the semiconductor layers in the first semiconductor region and the semiconductor layers in the second semiconductor region are formed at even intervals in the direction perpendicular to the channel current direction.

29. The process for manufacturing a semiconductor device as claimed in claim 17, wherein in the step of forming the fin-type semiconductor layers, at least a part covered by the gate electrode(s) in the semiconductor layers in the first semiconductor region is formed such that the part has a substantially cuboid shape.

30. The process for manufacturing a semiconductor device as claimed in claim 17, wherein in the step of forming the fin-type semiconductor layers, the semiconductor layers in the first semiconductor region are formed such that the semiconductor layers have a substantially cuboid shape.

31. The process for manufacturing a semiconductor device as claimed in claim 17, wherein in the step of forming the transistor, the semiconductor layers in the second semiconductor region are formed in both sides of the first semiconductor region such that a length of the semiconductor layers in the channel current direction is longer than a length of the gate electrode(s).

32. The process for manufacturing a semiconductor device as claimed in claim 17, wherein in the step of forming the transistor, the semiconductor layers in the second semiconductor region are formed in both sides of the first semiconductor region such that a length of the semiconductor layers in the channel current direction is longer than a length of the semiconductor layers in the first semiconductor region.

33. The process for manufacturing a semiconductor device as claimed in claim 17, wherein in the step of forming the transistor, the semiconductor layers in the second semiconductor region are formed in both sides of the first semiconductor region such that a width of the semiconductor layers in the direction perpendicular to the channel current direction is equal to or larger than a width of the semiconductor layers in the first semiconductor region.

34. The process for manufacturing a semiconductor device as claimed in claim 17, wherein in the step of forming the fin-type semiconductor layers, a pair of semiconductor layers are further formed as the second semiconductor region, which connects from one semiconductor layer to the other semiconductor layer of the semiconductor layers in both sides of the first semiconductor region such that the second semiconductor region surrounds the first semiconductor region.

* * * * *